(12) United States Patent
Komada

(10) Patent No.: US 8,445,930 B2
(45) Date of Patent: May 21, 2013

(54) NITRIDE SEMICONDUCTOR ELEMENT, METHODS FOR MANUFACTURING NITRIDE SEMICONDUCTOR ELEMENT AND NITRIDE SEMICONDUCTOR LAYER, AND NITRIDE SEMICONDUCTOR LIGHT-EMITTING ELEMENT

(75) Inventor: Satoshi Komada, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 417 days.

(21) Appl. No.: 12/849,509

(22) Filed: Aug. 3, 2010

(65) Prior Publication Data

US 2011/0049544 A1    Mar. 3, 2011

(30) Foreign Application Priority Data

Sep. 1, 2009  (JP) ................................. 2009-201602
Jun. 14, 2010  (JP) ................................. 2010-134988

(51) Int. Cl.
*H01L 33/00* (2010.01)
(52) U.S. Cl.
USPC ......... 257/98; 257/628; 257/E33.003; 438/29
(58) Field of Classification Search ................... 257/79, 257/98, 103, 622, 628, E33.003; 438/29
See application file for complete search history.

(56) References Cited

U.S. PATENT DOCUMENTS

| 2002/0038870 | A1* | 4/2002 | Kunisato et al. ................ 257/85 |
| 2002/0185660 | A1 | 12/2002 | Biwa et al. |
| 2004/0113166 | A1* | 6/2004 | Tadatomo et al. ............. 257/98 |
| 2005/0098791 | A1* | 5/2005 | Goto et al. .................... 257/103 |
| 2006/0060833 | A1 | 3/2006 | Bruckner et al. |

FOREIGN PATENT DOCUMENTS

| EP | 1 005 068 | 5/2000 |
| JP | 2001-126985 | 5/2001 |
| JP | 2001-267692 | 9/2001 |
| JP | 2002-43233 | 2/2002 |
| JP | 2003-124124 | 4/2003 |
| JP | 2004-363251 | 12/2004 |
| JP | 2006-36561 | 2/2006 |
| JP | 2006-74050 | 3/2006 |
| JP | 2009-59974 | 3/2009 |
| JP | 4304750 | 7/2009 |
| WO | WO-01/25511 | 4/2001 |

* cited by examiner

*Primary Examiner* — Julio J Maldonado
*Assistant Examiner* — Daniel Shook
(74) *Attorney, Agent, or Firm* — Morrison & Foerster LLP

(57) ABSTRACT

Described herein is a method for manufacturing a nitride semiconductor layer by stacking, on a silicon nitride layer, the first nitride semiconductor layer having a surface inclined with respect to the surface of the silicon nitride layer and then stacking the second nitride semiconductor layer on the first nitride semiconductor layer, a nitride semiconductor element and a nitride semiconductor light-emitting element each including the nitride semiconductor layer; and a method for manufacturing the nitride semiconductor element.

38 Claims, 13 Drawing Sheets

NITRIDE SEMICONDUCTOR ELEMENT, METHODS FOR MANUFACTURING NITRIDE SEMICONDUCTOR ELEMENT AND NITRIDE SEMICONDUCTOR LAYER, AND NITRIDE SEMICONDUCTOR LIGHT-EMITTING ELEMENT

This nonprovisional application is based on Japanese Patent Application No. 2009-201602 filed on Sep. 1, 2009 and No. 2010-134988 filed on Jun. 14, 2010, with the Japan Patent Office, the entire contents of which are hereby incorporated by reference.

BACKGROUND OF THE INVENTION

1. Field of the Invention

The present invention relates to a nitride semiconductor element such as a light-emitting device including a nitride semiconductor light-emitting diode element, a nitride semiconductor laser element and the like and an electronic device including a nitride semiconductor transistor element and the like; a method for manufacturing the nitride semiconductor element; a method for manufacturing a nitride semiconductor layer; and a nitride semiconductor light-emitting element.

2. Description of the Background Art

Conventionally, a GaN substrate, an SiC substrate, a sapphire substrate, and the like are used as a substrate used for a nitride semiconductor element. From the viewpoint of improving mass productivity of the nitride semiconductor element while allowing a decrease in manufacturing cost, a sapphire substrate is often used.

However, when a nitride semiconductor element is fabricated by stacking a nitride semiconductor layer on the sapphire substrate, dislocation (threading dislocation) propagating through the nitride semiconductor layer forming a nitride semiconductor element in its thickness direction may occur due to a high lattice mismatch ratio between the sapphire substrate and the nitride semiconductor layer.

The above-described threading dislocation leads to deterioration in characteristics of various nitride semiconductor elements such as a decrease in light emission efficiency in the nitride semiconductor light-emitting diode element, a shortened lifespan of the nitride semiconductor laser element, and reduction in electron mobility in the nitride semiconductor transistor element.

Thus, for example, Patent Document 1 (Japanese Patent Laying-Open No. 2002-043233) discloses that a GaN semiconductor layer is stacked on a sapphire substrate, an SiN layer provided with a plurality of openings is stacked on the GaN semiconductor layer, and a GaN semiconductor layer is further stacked on the SiN layer, thereby decreasing the dislocation density in the GaN semiconductor layer corresponding to the topmost layer, to allow improvement in crystallinity.

SUMMARY OF THE INVENTION

According to the method disclosed in the above-described Patent Document 1, although a GaN semiconductor layer does not grow in the area where the SiN layer exists on the GaN semiconductor layer, the GaN semiconductor layer grows in the vertical direction from the opening of the SiN layer in which the SiN layer does not exist, and then grows in the horizontal direction, which causes the GaN semiconductor layer to be stacked on the SiN layer.

However, when threading dislocation occurs in the underlying GaN semiconductor layer exposed through the opening of the SiN layer, propagation of the threading dislocation cannot be prevented by the SiN layer, which causes the threading dislocation to propagate also to the GaN semiconductor layer on the SiN layer. This poses a problem that the dislocation density in the GaN semiconductor layer corresponding to the topmost layer cannot be effectively decreased.

In addition, in the case where the opening in the surface of the SiN layer is reduced in area and the SiN layer in the surface of the sapphire substrate is increased in coverage rate, there is a problem that the flatness of the surface of the GaN semiconductor layer corresponding to the topmost layer may be deteriorated.

Therefore, it cannot be said that the problem of deterioration in the characteristics of the nitride semiconductor element can be fully solved, even in the case where a nitride semiconductor element is fabricated by stacking a nitride semiconductor layer on the surface of the GaN semiconductor layer corresponding to the topmost layer which is fabricated using the method disclosed in Patent Document 1.

In view of the foregoing, an object of the present invention is to provide a nitride semiconductor element which allows improvement in characteristics, a method for manufacturing the nitride semiconductor element, and a nitride semiconductor light-emitting element.

It is a further object of the present invention to provide a method for manufacturing a nitride semiconductor layer exhibiting excellent surface flatness while allowing improvement in crystallinity.

The present invention provides a nitride semiconductor element including a substrate; a third nitride semiconductor layer having a single-layer structure or a multilayer structure provided on the substrate; a silicon nitride layer provided on the third nitride semiconductor layer; a first nitride semiconductor layer provided on the silicon nitride layer; and a second nitride semiconductor layer provided on the first nitride semiconductor layer. At least a part of the first nitride semiconductor layer has a surface inclined with respect to a surface of the silicon nitride layer.

In the nitride semiconductor element according to the present invention, it is preferable that the surface of the first nitride semiconductor layer is inclined at an angle of 45° or more and 65° or less with respect to the surface of the silicon nitride layer.

Furthermore, in the nitride semiconductor element according to the present invention, it is preferable that the silicon nitride layer and the first nitride semiconductor layer are in contact with each other.

Furthermore, in the nitride semiconductor element according to the present invention, it is preferable that the first nitride semiconductor layer and the second nitride semiconductor layer are in contact with each other.

Furthermore, in the nitride semiconductor element according to the present invention, it is preferable that a nitride semiconductor buffer layer is provided between the substrate and the silicon nitride layer.

Furthermore, in the nitride semiconductor element according to the present invention, it is preferable that the nitride semiconductor buffer layer is a nitride semiconductor layer formed of a nitride semiconductor represented by an expression $Al_{x1}Ga_{1-x1}N$ ($0 < x1 \leq 1$).

Furthermore, the present invention provides a method for manufacturing a nitride semiconductor element. The method includes the steps of forming a silicon nitride layer on a substrate; forming, on the silicon nitride layer, a first nitride semiconductor layer having a surface inclined with respect to a surface of the silicon nitride layer; and forming, on the first nitride semiconductor layer, a second nitride semiconductor layer to fill a gap defined by the surfaces of the first nitride semiconductor layers each inclined with respect to the surface of the silicon nitride layer.

In the method for manufacturing a nitride semiconductor element according to the present invention, it is preferable that a mole ratio of a V group element to a III group element supplied during formation of the second nitride semiconductor layer is greater than the mole ratio of the V group element to the III group element supplied during formation of the first nitride semiconductor layer.

Furthermore, in the method for manufacturing a nitride semiconductor element according to the present invention, it is preferable that a mole ratio of a V group element to a III group element supplied during formation of the first nitride semiconductor layer is less than 1000.

Furthermore, in the method for manufacturing a nitride semiconductor element according to the present invention, it is preferable that a mole ratio of a V group element to a III group element supplied during formation of the second nitride semiconductor layer is 1000 or more.

Furthermore, in the method for manufacturing a nitride semiconductor element according to the present invention, it is preferable that a temperature of the substrate is lower during formation of the first nitride semiconductor layer than during formation of the second nitride semiconductor layer.

Furthermore, in the method for manufacturing a nitride semiconductor element according to the present invention, it is preferable that the first nitride semiconductor layer is formed by supplying gas containing nitrogen gas.

Furthermore, in the method for manufacturing a nitride semiconductor element according to the present invention, it is preferable that the first nitride semiconductor layer is formed under a pressure atmosphere of $6.7 \times 10^4$ Pa or more.

Furthermore, in the method for manufacturing a nitride semiconductor element according to the present invention, it is preferable that the first nitride semiconductor layer is formed such that the surface of the first nitride semiconductor layer is inclined at an angle of 45° or more and 65° or less with respect to the surface of the silicon nitride layer.

Furthermore, in the method for manufacturing a nitride semiconductor element according to the present invention, it is preferable that the silicon nitride layer is formed by supplying gas containing nitrogen gas.

Furthermore, the present invention provides a method for manufacturing a nitride semiconductor element. The method includes the steps of forming, on a substrate, a nitride semiconductor buffer layer corresponding to a nitride semiconductor layer formed of a nitride semiconductor represented by an expression $Al_{x1}Ga_{1-x1}N$ (0<x1≦1); forming a nitride semiconductor underlying layer on the nitride semiconductor buffer layer; forming a silicon nitride layer on the nitride semiconductor underlying layer; forming, on the silicon nitride layer, a first nitride semiconductor layer having a surface inclined with respect to a surface of the silicon nitride layer; and forming, on the first nitride semiconductor layer, a second nitride semiconductor layer to fill a gap defined by the surfaces of the first nitride semiconductor layers each inclined with respect to the surface of the silicon nitride layer.

Furthermore, the present invention provides a method for manufacturing a nitride semiconductor layer. The method includes the steps of forming a silicon nitride layer on a substrate; forming, on the silicon nitride layer, a first nitride semiconductor layer having a surface inclined with respect to a surface of the silicon nitride layer; and forming, on the first nitride semiconductor layer, a second nitride semiconductor layer to fill a gap defined by the surfaces of the first nitride semiconductor layers each inclined with respect to the surface of the silicon nitride layer.

Furthermore, the present invention provides a method for manufacturing a nitride semiconductor layer. The method includes the steps of forming, on a substrate, a nitride semiconductor buffer layer corresponding to a nitride semiconductor layer formed of a nitride semiconductor represented by an expression $Al_{x1}Ga_{1-x1}N$ (0<x1≦1); forming a nitride semiconductor underlying layer on the nitride semiconductor buffer layer; forming a silicon nitride layer on the nitride semiconductor underlying layer; forming, on the silicon nitride layer, a first nitride semiconductor layer having a surface inclined with respect to a surface of the silicon nitride layer; and forming, on the first nitride semiconductor layer, a second nitride semiconductor layer to fill a gap defined by the surfaces of the first nitride semiconductor layers each inclined with respect to the surface of the silicon nitride layer.

Furthermore, the present invention provides a nitride semiconductor light-emitting element at least including a substrate; a third nitride semiconductor layer having a single-layer structure or a multilayer structure provided on the substrate; a silicon nitride layer provided on the third nitride semiconductor layer; a first nitride semiconductor layer provided on the silicon nitride layer; a second nitride semiconductor layer provided on the first nitride semiconductor layer; a first conductivity type nitride semiconductor layer provided on the second nitride semiconductor layer; a nitride semiconductor active layer provided on the first conductivity type nitride semiconductor layer; and a second conductivity type nitride semiconductor layer provided on the nitride semiconductor active layer. At least a part of the first nitride semiconductor layer has a surface inclined with respect to a surface of the silicon nitride layer. In this case, it is preferable that the second nitride semiconductor layer contains a surface active element made of at least one of magnesium and zinc. Furthermore, it is more preferable that the surface active element has an atom concentration of $1 \times 10^{17}/cm^3$ or more and $1 \times 10^{20}/cm^3$ or less.

Furthermore, the present invention provides a nitride semiconductor light-emitting element at least including a substrate; a third nitride semiconductor layer having a single-layer structure or a multilayer structure provided on the substrate; a silicon nitride layer provided on the third nitride semiconductor layer; a first nitride semiconductor layer provided on the silicon nitride layer; a first conductivity type nitride semiconductor layer provided on the first nitride semiconductor layer; a nitride semiconductor active layer provided on the first conductivity type nitride semiconductor layer; and a second conductivity type nitride semiconductor layer provided on the nitride semiconductor active layer. At least a part of the first nitride semiconductor layer has a surface inclined with respect to a surface of the silicon nitride layer.

Furthermore, in the nitride semiconductor light-emitting element according to the present invention, it is preferable that the substrate has a concavo-convex structure in a surface thereof on which the third nitride semiconductor layer is provided.

Furthermore, the present invention provides a nitride semiconductor light-emitting element at least including a substrate having a surface provided with a concavo-convex structure; a third nitride semiconductor layer having a single-layer structure or a multilayer structure provided on the surface of the substrate provided with the concavo-convex structure; a silicon nitride layer provided on the third nitride semiconductor layer; a first nitride semiconductor layer provided on the silicon nitride layer; a second nitride semiconductor layer provided on the first nitride semiconductor layer; a first conductivity type nitride semiconductor layer provided on the second nitride semiconductor layer; a nitride semiconductor active layer provided on the first conductivity type nitride semiconductor layer; and a second conductivity type nitride semiconductor layer provided on the nitride semiconductor active layer. At least a part of a surface of the silicon nitride layer is located below an upper surface of a convex portion of the concavo-convex structure in the surface of the substrate. In this case, it is preferable that the second nitride semiconductor layer contains a surface active element made of at least one of magnesium and zinc. Furthermore, it is more preferable that the surface active element has an atom concentration of $1 \times 10^{17}/cm^3$ or more and $1 \times 10^{20}/cm^3$ or less.

Furthermore, the present invention provides a nitride semiconductor light-emitting element at least including a substrate having a surface provided with a concavo-convex structure; a third nitride semiconductor layer having a single-layer structure or a multilayer structure provided on the surface of the substrate provided with the concavo-convex structure; a silicon nitride layer provided on the third nitride semiconductor layer; a first nitride semiconductor layer provided on the silicon nitride layer; a first conductivity type nitride semiconductor layer provided on the first nitride semiconductor layer; a nitride semiconductor active layer provided on the first conductivity type nitride semiconductor layer; and a second conductivity type nitride semiconductor layer provided on the nitride semiconductor active layer. At least a part of a surface of the silicon nitride layer is located below an upper surface of a convex portion of the concavo-convex structure in the surface of the substrate.

Furthermore, in the nitride semiconductor light-emitting element according to the present invention, it is preferable that the third nitride semiconductor layer at least includes a nitride semiconductor buffer layer provided on the substrate and a nitride semiconductor underlying layer provided on the nitride semiconductor buffer layer.

Furthermore, in the nitride semiconductor light-emitting element according to the present invention, it is preferable that a crystal orientation of the surface of the substrate is inclined in a <11-20> direction or a <1-100> direction with respect to a <0001> direction. In this case, it is more preferable that an angle of the inclination is 0.05° or more and 2° or less.

According to the present invention, a nitride semiconductor element allowing improvement in characteristics, a method for manufacturing the nitride semiconductor element, and a nitride semiconductor light-emitting element can be provided.

Furthermore, according to the present invention, a method for manufacturing a nitride semiconductor layer exhibiting excellent surface flatness while allowing improvement in crystallinity can be provided.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
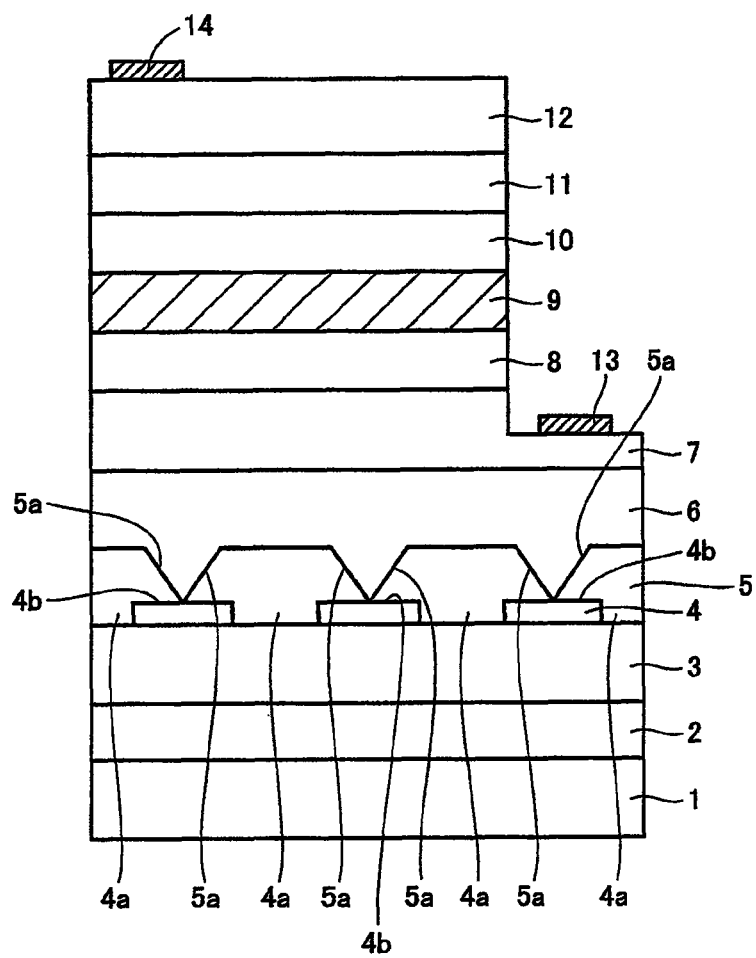
FIG. 1 is a schematic cross sectional view of a nitride semiconductor light-emitting diode element according to the first embodiment.

The embodiments of the present invention will be hereinafter described with reference to the accompanying drawings, in which the same or corresponding components are designated by the same reference characters, and description thereof will not be repeated.

First Embodiment

FIG. 1 is a schematic cross sectional view of a nitride semiconductor light-emitting diode element according to the first embodiment which is an example of the nitride semiconductor element of the present invention.

The nitride semiconductor light-emitting diode element according to the first embodiment includes a substrate 1; a nitride semiconductor buffer layer 2 provided in contact with the surface of substrate 1; a nitride semiconductor underlying layer 3 provided in contact with the surface of nitride semiconductor buffer layer 2; a silicon nitride layer 4 having an opening 4a and provided in contact with the surface of nitride semiconductor underlying layer 3; a first nitride semiconductor layer 5 provided in contact with the surface of silicon nitride layer 4 and extending through opening 4a of silicon nitride layer 4; a second nitride semiconductor layer 6 provided in contact with the surface of first nitride semiconductor layer 5; an n-type nitride semiconductor layer 7 provided in contact with the surface of second nitride semiconductor layer 6; a nitride semiconductor superlattice structure layer 8 provided in contact with the surface of n-type nitride semiconductor layer 7; a nitride semiconductor active layer 9 provided in contact with the surface of nitride semiconductor superlattice structure layer 8; a first p-type nitride semiconductor layer 10 provided in contact with the surface of nitride semiconductor active layer 9; a second p-type nitride semiconductor layer 11 provided in contact with the surface of first p-type nitride semiconductor layer 10; and a translucent electrode layer 12 provided in contact with the surface of second p-type nitride semiconductor layer 11. In addition, an n-side electrode 13 is provided in contact with the exposed surface of n-type nitride semiconductor layer 7, and a p-side electrode 14 is provided in contact with the surface of translucent electrode layer 12. It is to be noted that a thickness of silicon nitride layer 4 is preferably 10 nm or less, and more preferably 2 nm or less. In the case where silicon nitride layer 4 is formed to have a thickness of 10 nm or less, particularly 2 nm or less, silicon nitride layer 4 is formed to be extremely thin, which tends to cause spontaneous generation of opening 4a due to nonuniformity in thickness of silicon nitride layer 4.

In the nitride semiconductor light-emitting diode element according to the first embodiment, first nitride semiconductor layer 5 has a surface (hereinafter referred to as an "inclined facet") 5a inclined with respect to a surface 4b of silicon nitride layer 4.

An example of the method for manufacturing a nitride semiconductor light-emitting diode element according to the first embodiment will be hereinafter described.

Figure 2:
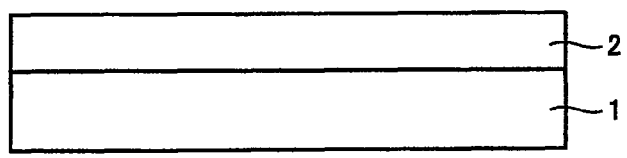
FIG. 2 is a schematic cross sectional view illustrating a part of the manufacturing step in an example of a method for manufacturing the nitride semiconductor light-emitting diode element according to the first embodiment.

First, as shown in the schematic cross sectional view in FIG. 2, nitride semiconductor buffer layer 2 is stacked on the surface of substrate 1 by the MOCVD (Metal Organic Chemical Vapor Deposition) method.

In this case, for example, a sapphire substrate, a silicon carbide substrate, a gallium nitride substrate, a zinc oxide substrate or the like can be used as substrate 1.

It is preferable that the crystal orientation of the surface of substrate 1 is inclined in the <11-20> direction or the <1-100> direction with respect to the <0001> direction. When substrate 1 having an inclined surface as described above is used, the nitride semiconductor layer formed on the surface of substrate 1 exhibits step flow growth by the step portion formed by inclination of this surface. This facilitates two-dimensional growth to exhibit a tendency to improve the surface morphology of the nitride semiconductor layer.

When the crystal orientation of the surface of substrate 1 is inclined in the <11-20> direction or the <1-100> direction with respect to the <0001> direction, it is preferable that the angle of the inclination is 0.05° or more and 2° or less. When this angle of the inclination is less than 0.05°, the nitride semiconductor layer tends not to exhibit a step flow growth. When this angle of the inclination is greater than 2°, the step portion is excessively increased in density to cause a decrease in width of the terrace portion, which causes the step portions to be integrated into a larger macro-step portion. Consequently, the surface of the nitride semiconductor layer formed on the surface of substrate 1 tends to be roughened. When the angle of the inclination is 0.05° or more and 2° or less, there is a tendency that the nitride semiconductor layer is facilitated to achieve step flow growth on the surface of substrate 1, thereby allowing improvement in the surface morphology of the nitride semiconductor layer.

Furthermore, it is preferable that nitride semiconductor buffer layer 2 is provided, for example, by stacking a nitride semiconductor layer formed of a nitride semiconductor which is represented by an expression $Al_{x1}Ga_{1-x1}N$ ($0 \leq x1 \leq 1$), assuming that the surface temperature of substrate 1 is 400° C. or more and 700° C. or less.

Figure 3:
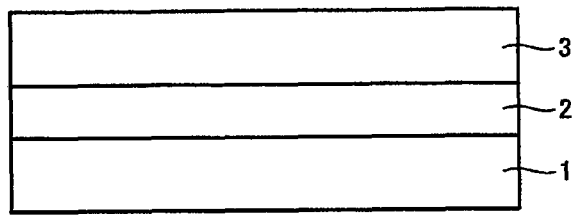
FIG. 3 is a schematic cross sectional view illustrating another part of the manufacturing step in an example of the method for manufacturing the nitride semiconductor light-emitting diode element according to the first embodiment.

Then, as shown in the schematic cross sectional view in FIG. 3, nitride semiconductor underlying layer 3 is stacked on the surface of nitride semiconductor buffer layer 2 by the MOCVD method.

In this case, although nitride semiconductor underlying layer 3 can be provided, for example, by stacking a nitride semiconductor layer formed of a nitride semiconductor which is represented by an expression $Al_{x2}Ga_{y2}In_{z2}N$ ($0 \leq x2 \leq 1, 0 \leq y2 \leq 1, 0 \leq z2 \leq 1, x2+y2+z2 \neq 0$), it is preferable to stack a GaN layer for the purpose of improving the crystallinity of nitride semiconductor underlying layer 3.

Figure 4:
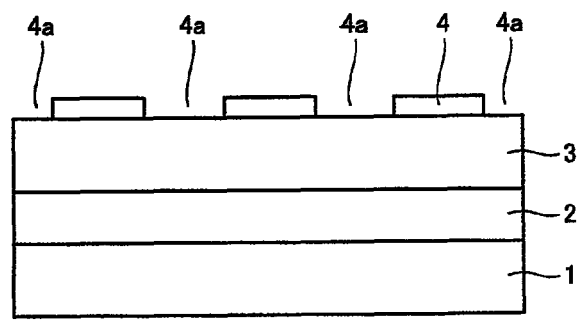
FIG. 4 is a schematic cross sectional view illustrating another part of the manufacturing step in an example of the method for manufacturing the nitride semiconductor light-emitting diode element according to the first embodiment.

Then, as shown in the schematic cross sectional view in FIG. 4, silicon nitride layer 4 having a plurality of openings 4a is stacked on the surface of nitride semiconductor underlying layer 3 by the MOCVD method, in which the surface of nitride semiconductor underlying layer 3 is exposed from openings 4a of silicon nitride layer 4.

Silicon nitride layer 4 having the plurality of openings 4a can be provided, for example, by supplying, into the MOCVD apparatus, silicon source gas such as silane and/or monomethyl silane and nitrogen source gas such as ammonia along with carrier gas such as nitrogen gas, and stopping supply of the above-mentioned silicon source gas and nitrogen source gas into the MOCVD apparatus at the time when silicon nitride layer 4 is partially formed on the surface of nitride semiconductor underlying layer 3.

When silicon nitride layer 4 having the plurality of openings 4a as described above is stacked on the surface of nitride semiconductor underlying layer 3, first nitride semiconductor layer 5 can be selectively grown on the surface of nitride semiconductor underlying layer 3 exposed from openings 4a of silicon nitride layer 4 in the process described below. Furthermore, in the region where silicon nitride layer 4 is disposed, the propagation of dislocation such as threading dislocation occurring in nitride semiconductor underlying layer 3 can be prevented by silicon nitride layer 4.

Furthermore, silicon nitride layer 4 can serve as a layer for releasing at least a part of the internal stress of the element produced by distortion. When silicon nitride layer 4 serves to release at least a part of the internal stress of the element produced by distortion, warpage can be reduced which occurs in the element when the nitride semiconductor layer stacked on silicon nitride layer 4 is increased in thickness for fabricating an element or when the nitride semiconductor layer is stacked on the surface of substrate 1 having a large diameter for fabricating an element.

Figure 5:
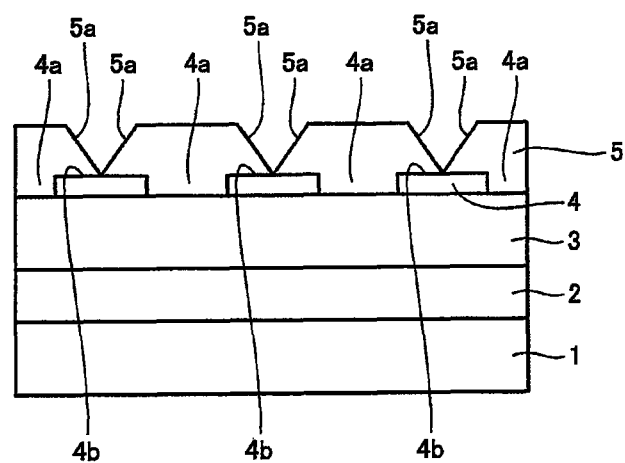
FIG. 5 is a schematic cross sectional view illustrating another part of the manufacturing step in an example of the method for manufacturing the nitride semiconductor light-emitting diode element according to the first embodiment.

Then, as shown in the schematic cross sectional view in FIG. 5, first nitride semiconductor layer 5 is selectively grown by the MOCVD method from the surface of nitride semiconductor underlying layer 3 exposed from openings 4a of silicon nitride layer 4, to stack first nitride semiconductor layer 5 so as to cover at least a part of silicon nitride layer 4.

In this case, nitride semiconductor underlying layer 5 can be provided, for example, by stacking a nitride semiconductor layer formed of a nitride semiconductor which is represented by an expression $Al_{x3}Ga_{y3}In_{z3}N$ ($0 \leq x3 \leq 1$, $0 \leq y3 \leq 1$, $0 \leq z3 \leq 1$, $x3+y3+z3 \neq 0$).

First nitride semiconductor layer 5 is formed so as to have an inclined facet 5a which is a surface inclined with respect to surface 4b of silicon nitride layer 4. As first nitride semiconductor layer 5 has inclined facet 5a, for example, as indicated by an arrow in the schematic cross sectional view in FIG. 6, the propagation direction of dislocation propagated from opening 4a of silicon nitride layer 4 toward first nitride semiconductor layer 5 selectively grown can be deflected from the vertical direction (the direction perpendicular to the surface of substrate 1 in the present embodiment) to the horizontal direction (the direction parallel to the surface of substrate 1 in the present embodiment). Consequently, the dislocation density in an upper surface 5b of first nitride semiconductor layer 5 can be significantly reduced.

First nitride semiconductor layer 5 has inclined facet 5a inclined with respect to surface 4b of silicon nitride layer 4 parallel thereto in the horizontal direction, which allows deflection of the propagation direction of dislocation extending in the vertical direction. It is considered that this is because upper surface 5b of first nitride semiconductor layer 5 is decreased in the exposed area due to inclined facet 5a, with the result that the dislocation which should be essentially propagated in the vertical direction is spatially limited, and therefore, deflected in the horizontal direction.

Furthermore, although an angle θ1 formed between inclined facet 5a of first nitride semiconductor layer 5 and surface 4b of silicon nitride layer 4 is particularly not limited, it is preferable that the angle is 45° or more and 60° or less. When angle θ1 formed between inclined facet 5a of first nitride semiconductor layer 5 and surface 4b of silicon nitride layer 4 is 45° or more and 60° or less, there is a tendency that the propagation direction of the dislocation extending in the vertical direction can be further efficiently deflected in first nitride semiconductor layer 5. Furthermore, first nitride semiconductor layer 5 can be configured to have a height h1, for example, of 0.1 μm or more and 5 μm or less.

Figure 6:
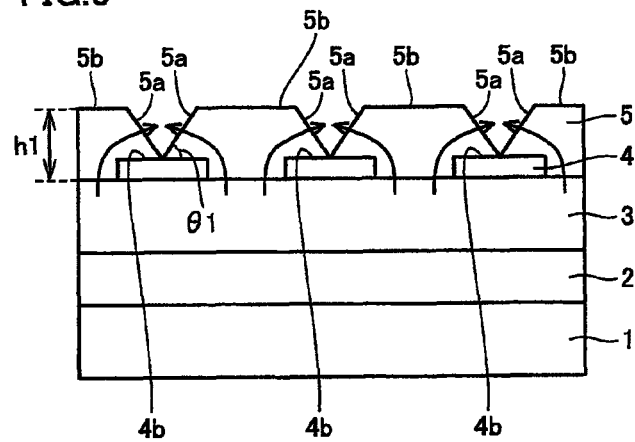
FIG. 6 is a schematic cross sectional view of an example of a substrate obtained after the first nitride semiconductor layer is formed.
Figure 7:
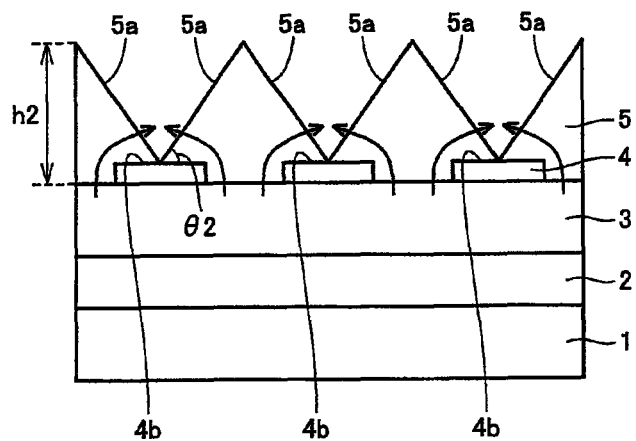
FIG. 7 is a schematic cross sectional view of another examples of the substrate obtained after the first nitride semiconductor layer is formed.

Furthermore, for example, as shown in the schematic cross sectional view in FIG. 7, it is preferable that first nitride semiconductor layer 5 does not have upper surface 5b shown in FIGS. 5 and 6, but has inclined facet 5a having a cross section of an inverted V shape. In this case, there is an increasing tendency that the propagation direction of the dislocation extending in the vertical direction can be efficiently deflected in first nitride semiconductor layer 5.

In addition, it is preferable that an angle θ2 shown in FIG. 7 and formed between inclined facet 5a of first nitride semiconductor layer 5 and surface 4b of silicon nitride layer 4 is 45° or more and 60° or less. Furthermore, first nitride semiconductor layer 5 can be configured to have a height h2, for example, of 0.1 μm or more and 10 μm or less.

The conditions for forming inclined facet 5a in first nitride semiconductor layer 5 as described above include, for example, (i) reducing the mole ratio of the V group element to the III group element supplied at the time when first nitride semiconductor layer 5 is stacked (the mole number of the V group element/the mole number of the III group element, which will be hereinafter referred to as a "V/III ratio"); (ii) lowering the temperature of substrate 1 at the time when first nitride semiconductor layer 5 is stacked; (iii) raising the pressure of the atmosphere at the time when first nitride semiconductor layer 5 is stacked; and (iv) mixing nitrogen gas into carrier gas; and the like. More specifically, (i) it is preferable that the V/III ratio is less than 1000 at the time when first nitride semiconductor layer 5 is stacked; (ii) it is preferable that the temperature of substrate 1 is 850° C. or more and 950° C. or less at the time when first nitride semiconductor layer 5 is stacked; (iii) it is preferable that the pressure of the atmosphere is 500 Torr or more ($6.7 \times 10^4$ Pa or more) at the time when first nitride semiconductor layer 5 is stacked.

Figure 8:
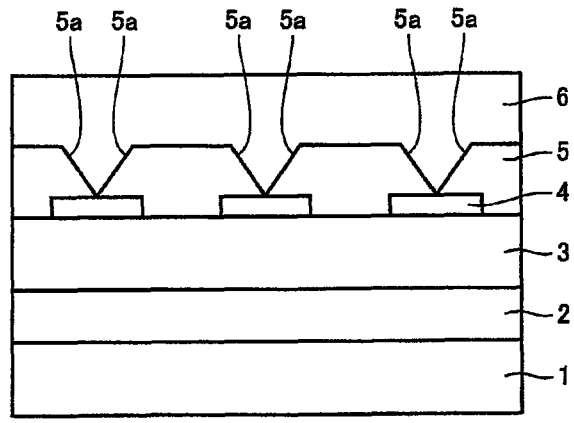
FIG. 8 is a schematic cross sectional view illustrating another part of the manufacturing step in an example of the method for manufacturing the nitride semiconductor light-emitting diode element according to the first embodiment.

Then, as shown in the schematic cross sectional view in FIG. 8, second nitride semiconductor layer 6 is stacked on the surface of first nitride semiconductor layer 5 by the MOCVD method. Second nitride semiconductor layer 6 is stacked so as to fill the gap defined by inclined facets 5a of first nitride semiconductor layers 5. Since second nitride semiconductor layer 6 stacked in this way is stacked on the surface of first nitride semiconductor layer 5 in which the propagation direction of dislocation is deflected, second nitride semiconductor layer 6 can be decreased in dislocation density and improved in crystallinity, and also improved in surface flatness.

In this case, second nitride semiconductor layer 6 can be provided, for example, by stacking a nitride semiconductor layer formed of a nitride semiconductor which is represented by an expression $Al_{x4}Ga_{y4}In_{z4}N$ ($0 \leq x4 \leq 1$, $0 \leq y4 \leq 1$, $0 \leq z4 \leq 1$, $x4+y4+z4 \neq 0$).

It is preferable that the V/III ratio is set to be higher during stacking of second nitride semiconductor layer 6 than during stacking of first nitride semiconductor layer 5. Particularly, it is preferable that the V/III ratio is set to be 1000 or more when second nitride semiconductor layer 6 is stacked. When the V/III ratio is set to be 1000 or more when second nitride semiconductor layer 6 is stacked, there is an increasing tendency that second nitride semiconductor layer 6 can be formed to have a reduced film thickness and a flatter surface.

Furthermore, second nitride semiconductor layer 6 is stacked such that the V/III ratio is set to be higher during stacking of second nitride semiconductor layer 6 than during stacking of first nitride semiconductor layer 5. This tends to allow a decrease in the half value width of the X-ray rocking curve of second nitride semiconductor layer 6 obtained by the X-ray diffraction method (hereinafter simply referred to as a "half value width"), thereby allowing improvement in crystallinity of second nitride semiconductor layer 6, as compared to the case where only one of first nitride semiconductor layer 5 and second nitride semiconductor layer 6 is stacked. In particular, by forming both of first nitride semiconductor layer 5 and second nitride semiconductor layer 6, the half value width of the (10-12) plane correlated to the edge dislocation in second nitride semiconductor layer 6 can be set, for example, to approximately 90 arcsec. Accordingly, it becomes possible to implement the value of the maximum level as a half value width of the (10-12) plane of the nitride semiconductor layer grown on the heterogeneous substrate such as a sapphire substrate obtained by the MOCVD method.

It is to be noted that although a crystal plane and direction should be essentially represented to have a bar ("-") above the figure as required, the bar ("-") is placed in front of the figure as required instead of placing the bar ("-") above the figure as required, due to restriction on the rule of representation in the description.

Furthermore, the V/III ratio during stacking of first nitride semiconductor layer 5 is set to be relatively low, and the V/III ratio during stacking of second nitride semiconductor layer 6 is set to be relatively high, which allows formation of each of first nitride semiconductor layer 5 having the characteristics shown in the following (a) and second nitride semiconductor layer 6 having the characteristics shown in the following (b).

(a) Characteristics which allow the propagation direction of dislocation to be deflected by formation of inclined facet 5a, and which are suitable for nucleus formation since the half value width of first nitride semiconductor layer 5 alone is large and the crystal grains forming first nitride semiconductor layer 5 are large in size.

(b) Characteristics which are suitable for the layer after nucleus formation since the half value width of second nitride semiconductor layer 6 alone is small.

By combining first nitride semiconductor layer 5 having the above-described characteristics (a) and second nitride semiconductor layer 6 having the above-described characteristics (b), the half value width and the dislocation density of second nitride semiconductor layer 6 stacked on first nitride semiconductor layer 5 can be significantly decreased as compared to those of second nitride semiconductor layer 6 alone. This allows improvement in crystallinity. This is considered as a synergistic effect resulting from combination of first nitride semiconductor layer 5 having the above-described characteristics (a) and second nitride semiconductor layer 6 having the above-described characteristics (b).

Furthermore, it is preferable that second nitride semiconductor layer 6 contains a surface active element made of at least one of magnesium and zinc. When second nitride semiconductor layer 6 contains a surface active element made of at least one of magnesium and zinc, two-dimensional growth is facilitated in growth of second nitride semiconductor layer 6, and the surface morphology of second nitride semiconductor layer 6 tends to be improved. It is to be noted that the surface active element made of at least one of magnesium and zinc can be introduced in any stage during growth and/or during suspension of growth of second nitride semiconductor layer 6.

Furthermore, when second nitride semiconductor layer 6 contains the surface active element made of at least one of magnesium and zinc, it is preferable that the surface active element in second nitride semiconductor layer 6 has an atom concentration of $1\times10^{17}/cm^3$ or more and $1\times10^{20}/cm^3$ or less. When the atom concentration of the surface active element in second nitride semiconductor layer 6 is less than $1\times10^{17}/cm^3$, the effect of introducing the surface active element into second nitride semiconductor layer 6 tends not to appear. When the atom concentration is greater than $1\times10^{20}/cm^3$, the crystallinity of second nitride semiconductor layer 6 tends to be deteriorated. When the surface active element in second nitride semiconductor layer 6 has an atom concentration of $1\times10^{17}/cm^3$ or more and $1\times10^{20}/cm^3$ or less, the surface morphology of second nitride semiconductor layer 6 tends to be improved without modification of the growth conditions for second nitride semiconductor layer 6.

Figure 9:
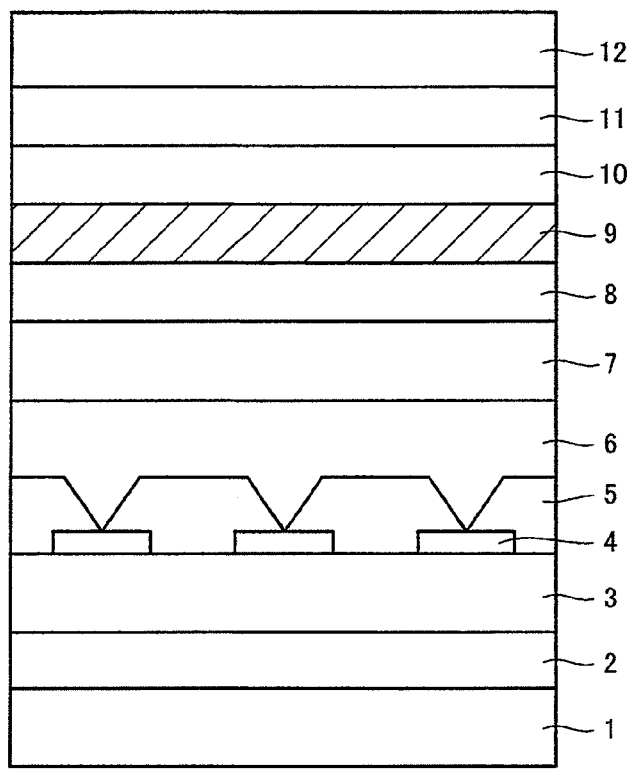
FIG. 9 is a schematic cross sectional view illustrating another part of the manufacturing step in an example of the method for manufacturing the nitride semiconductor light-emitting diode element according to the first embodiment.

As shown in the schematic cross sectional view in FIG. 9, after n-type nitride semiconductor layer 7, nitride semiconductor superlattice structure layer 8, nitride semiconductor active layer 9, first p-type nitride semiconductor layer 10, and second p-type nitride semiconductor layer 11 are stacked in this order on the surface of second nitride semiconductor layer 6 by the MOCVD method, translucent electrode layer 12 is stacked on the surface of second p-type nitride semiconductor layer 11 by the EB (Electron Beam) vapor deposition method and the like, to thereby form a stacked body.

In this case, n-type nitride semiconductor layer 7 can be provided, for example, by stacking a layer doped with an n-type dopant, and the like on the nitride semiconductor layer formed of a nitride semiconductor which is represented by an expression $Al_{x5}Ga_{y5}In_{z5}N$ ($0\leq x5\leq 1$, $0\leq y5\leq 1$, $0\leq z5\leq 1$, $x5+y5+z5\neq 0$).

Furthermore, nitride semiconductor superlattice structure layer 8 can be provided, for example, by alternately stacking, one by one, a nitride semiconductor layer formed of a nitride semiconductor which is represented by an expression $Al_{x6}Ga_{y6}In_{z6}N$ ($0\leq x6\leq 1$, $0\leq y6\leq 1$, $0\leq z6\leq 1$, $x6+y6+z6\neq 0$) and a nitride semiconductor layer formed of a nitride semiconductor which is represented by an expression $Al_{x7}Ga_{y7}In_{z7}N$ ($0\leq x7\leq 1$, $0\leq y7\leq 1$, $0\leq z7\leq 1$, $x7+y7+z7\neq 0$) which are different in composition from each other.

Furthermore, nitride semiconductor active layer 9 can be provided, for example, by alternately stacking, one by one, a nitride semiconductor well layer formed of a nitride semiconductor which is represented by an expression $Al_{x8}Ga_{y8}In_{z8}N$ ($0\leq x8\leq 1$, $0\leq y8\leq 1$, $0\leq z8\leq 1$, $x8+y8+z8\neq 0$) and a nitride semiconductor barrier layer having a band gap greater than that of the nitride semiconductor well layer and formed of a nitride semiconductor which is represented by an expression $Al_{x9}Ga_{y9}In_{z9}N$ ($0\leq x9\leq 1$, $0\leq y9\leq 1$, $0\leq z9\leq 1$, $x9+y9+z9\neq 0$) which are different in composition from each other. Although the number of nitride semiconductor well layers in nitride semiconductor active layer 9 can be, for example, six, the number is not limited thereto.

Furthermore, first p-type nitride semiconductor layer 10 can be provided, for example, by stacking a layer doped with a p-type dopant, and the like on the nitride semiconductor layer formed of a nitride semiconductor which is represented by an expression $Al_{x10}Ga_{y10}In_{z10}N$ ($0 \leq x10 \leq 1$, $0 \leq y10 \leq 1$, $0 \leq z10 \leq 1$, $x10+y10+z10 \neq 0$).

Furthermore, second p-type nitride semiconductor layer 11 can be provided, for example, by stacking a layer doped with a p-type dopant, and the like on the nitride semiconductor layer formed of a nitride semiconductor which is represented by an expression $Al_{x11}Ga_{y11}In_{z11}N$ ($0 \leq x11 \leq 1$, $0 \leq y11 \leq 1$, $0 \leq z11 \leq 1$, $x11+y11+z11 \neq 0$).

Furthermore, translucent electrode layer 12 can be provided, for example, by stacking a layer made of ITO (Indium Tin Oxide), and the like.

Figure 10:
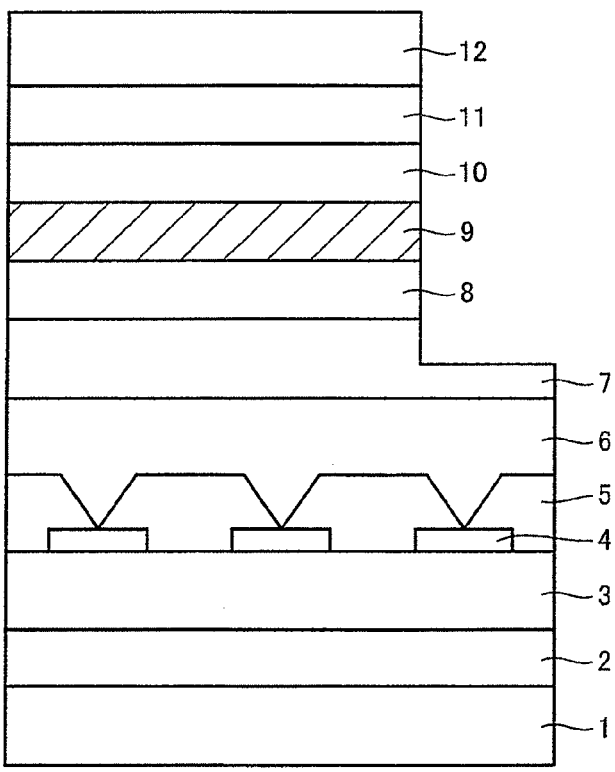
FIG. 10 is a schematic cross sectional view illustrating another part of the manufacturing step in an example of the method for manufacturing the nitride semiconductor light-emitting diode element according to the first embodiment.

Then, as shown in the schematic cross sectional view in FIG. 10, a part of the stacked body shown in FIG. 9 is removed by etching and the like to expose a part of the surface of n-type nitride semiconductor layer 7.

Then, as shown in FIG. 1, n-side electrode 13 is formed on the surface in which n-type nitride semiconductor layer 7 is exposed, and p-side electrode 14 is formed on the surface of translucent electrode layer 12, which allows fabrication of the nitride semiconductor light-emitting diode element according to the first embodiment.

According to the nitride semiconductor light-emitting diode element of the first embodiment fabricated in this way, in first nitride semiconductor layer 5, the propagation of dislocation to second nitride semiconductor layer 6 can be suppressed by deflecting the propagation direction of dislocation extending in the vertical direction, as described above. This allows improved crystallinity and excellent surface flatness in second nitride semiconductor layer 6.

Consequently, in the nitride semiconductor light-emitting diode element according to the first embodiment, the crystallinity can be improved by decreasing the dislocation density in each of n-type nitride semiconductor layer 7, nitride semiconductor superlattice structure layer 8, nitride semiconductor active layer 9, first p-type nitride semiconductor layer 10, and second p-type nitride semiconductor layer 11 which are stacked on the surface of second nitride semiconductor layer 6. Therefore, characteristics such as light emission efficiency can be improved.

For example, in the nitride semiconductor light-emitting diode element according to the first embodiment having the configuration shown in FIG. 1, the nitride semiconductor well layer of nitride semiconductor active layer 9 has a dislocation density of approximately $2 \times 10^8 / cm^2$ in the case where silicon nitride layer 4 is not employed. In contrast, in the nitride semiconductor light-emitting diode element according to the first embodiment having the configuration shown in FIG. 1 in which silicon nitride layer 4 is employed, the nitride semiconductor well layer of nitride semiconductor active layer 9 has a dislocation density of approximately $5 \times 10^7 / cm^2$ or less.

Furthermore, in the nitride semiconductor light-emitting diode element according to the first embodiment having the configuration shown in FIG. 1, when nitride semiconductor buffer layer 2 is made of AlN, the dislocation density of the nitride semiconductor well layer of nitride semiconductor active layer 9 can be further readily decreased by combination of nitride semiconductor buffer layer 2 made of AlN and silicon nitride layer 4. The inventor of the present invention considers that the component generally regarded as dislocation includes a screw dislocation component and an edge dislocation component. Since nitride semiconductor buffer layer 2 made of AlN is greater in the c-axis orientation, the screw dislocation component can be decreased. In addition, the edge dislocation component can be decreased by using silicon nitride layer 4. Therefore, the screw dislocation component and edge dislocation component which are different in dislocation component type can be simultaneously decreased by combining nitride semiconductor buffer layer 2 made of AlN and silicon nitride layer 4. Accordingly, the nitride semiconductor well layer of nitride semiconductor active layer 9 can be reduced in dislocation by the synergistic effect which is not a simple summation effect.

Described below is the relationship between the screw dislocation component/edge dislocation component and the light emission efficiency of the nitride semiconductor light-emitting diode element. The inventor of the present invention considered that screw dislocation exhibits a dislocation density which is not more than half that of the edge dislocation, but has a relatively large effective area for capturing carriers and mainly serves as the non-luminescent center, and therefore, can be reduced in dislocation as compared to the case of edge dislocation.

It is thought that the dislocation density generally measured mainly reflects the density of edge dislocation. There is a tendency that the light emission efficiency of the nitride semiconductor light-emitting diode element can be increased when the dislocation density of the nitride semiconductor well layer of nitride semiconductor active layer 9 measured particularly using CL (cathode luminescence) is $5 \times 10^7 / cm^2$ or less. It is thought that when the dislocation density of the nitride semiconductor well layer measured using the CL is $5 \times 10^7 / cm^2$ or less, the edge dislocation density and screw dislocation density of the nitride semiconductor well layer are $5 \times 10^7 / cm^2$ or less and $2.5 \times 10^7 / cm^2$ or less, respectively.

Generally, in the nitride semiconductor light-emitting diode element, the nitride semiconductor well layer forming nitride semiconductor active layer 9 is usually configured to have a thickness of about 2 to 3 nm due to the effects of the dislocation density. If the nitride semiconductor well layer is configured to have a thickness greater than this, the light emission efficiency of the nitride semiconductor light-emitting diode element will be decreased. Particularly, it is thought that when the nitride semiconductor well layer contains In, the nitride semiconductor well layer is thickly formed to cause aggregation of In around the dislocation, which then serves as the non-luminescent center, leading to a decrease in the light emission efficiency of the nitride semiconductor light-emitting diode element. In contrast, in the nitride semiconductor light-emitting diode element according to the first embodiment, the nitride semiconductor well layer forming nitride semiconductor active layer 9 can be configured to have a dislocation density of $5 \times 10^7 / cm^2$ or less. This tends to allow an increase in the light emission efficiency of the nitride semiconductor light-emitting diode element even when the nitride semiconductor well layer is thickly formed.

Particularly, the thickness of the nitride semiconductor well layer is preferably 4 nm or more, and more preferably 6 nm or more. When the nitride semiconductor well layer is configured to have a thickness of 4 nm or more, the increased thickness of the nitride semiconductor well layer allows a decrease in effective carrier concentration within the nitride semiconductor well layer. This tends to allow improvement in the light emission efficiency of the nitride semiconductor light-emitting diode element, which is achieved when a current having a large current density, for example, of 50 mA/cm² or more is introduced into the nitride semiconductor light-emitting diode element. This eliminates the need to use a plurality of nitride semiconductor light-emitting diode elements or a nitride semiconductor light-emitting diode element having a large area in order to introduce a current having a large current density, which allows a significant cost reduction for the nitride semiconductor light-emitting diode element. Furthermore, when the nitride semiconductor well layer is configured to have a thickness of 6 nm or more, discretization of the level by quantization is solved, to cause an instantaneous increase in the state density. This allows a further increase in the light emission efficiency of the nitride semiconductor light-emitting diode element at the time when a current having a large current density is introduced.

For the reasons as described above, in order to improve the light emission efficiency of the nitride semiconductor light-emitting diode element according to the first embodiment, it is preferable to provide a configuration in which AlN is used for nitride semiconductor buffer layer 2, nitride semiconductor active layer 9 having a nitride semiconductor well layer is formed on silicon nitride layer 4, and the nitride semiconductor well layer is configured to have a thickness of 4 nm or more, and more preferably 6 nm or more.

Figure 28:
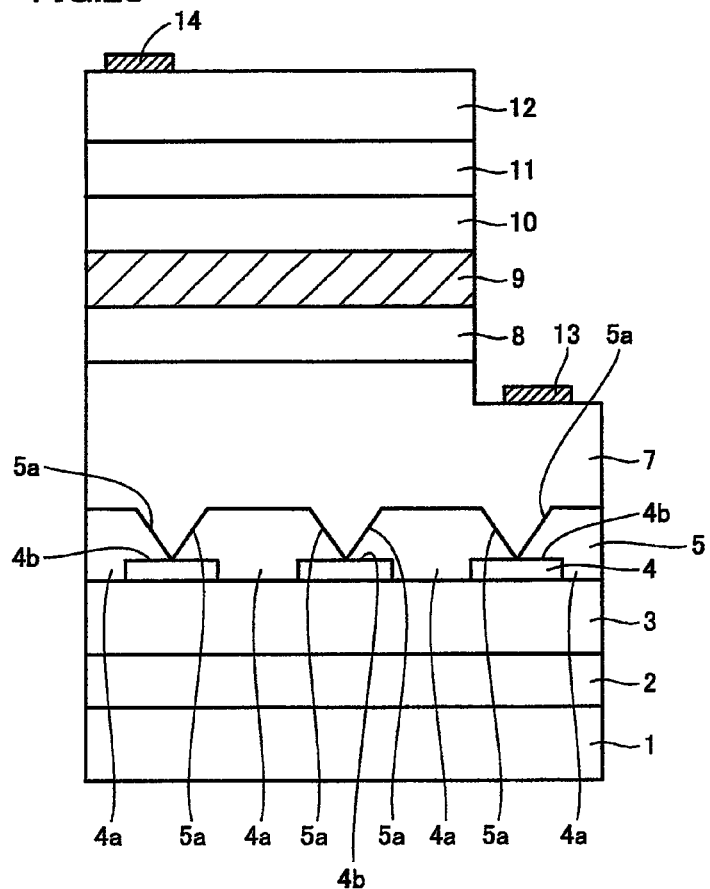
FIG. 28 is a schematic cross sectional view showing another configuration of the nitride semiconductor light-emitting diode element according to the first embodiment.

Furthermore, in the nitride semiconductor light-emitting diode element according to the first embodiment, n-type nitride semiconductor layer 7 may be formed directly on first nitride semiconductor layer 5, for example, as shown in the schematic cross sectional view in FIG. 28. Also in this case, for the reasons as described above, the propagation direction of dislocation can be deflected by first nitride semiconductor layer 5, and the dislocation density can be decreased to allow improvement in crystallinity in each of n-type nitride semiconductor layer 7, nitride semiconductor superlattice structure layer 8, nitride semiconductor active layer 9, first p-type nitride semiconductor layer 10, and second p-type nitride semiconductor layer 11 on first nitride semiconductor layer 5. Consequently, the characteristics such as light emission efficiency can be improved.

Second Embodiment

The present embodiment is characterized in that nitride semiconductor buffer layer 2 is stacked not by the MOCVD method but by the sputtering method.

In this case, nitride semiconductor buffer layer 2 may be provided, for example, by stacking a nitride semiconductor layer formed of a nitride semiconductor represented by an expression $Al_{x1}Ga_{1-x1}N$ ($0<x1\leqq1$) by the sputtering method. Particularly, it is preferable to stack, by the sputtering method, a nitride semiconductor layer formed of a nitride semiconductor represented by an expression $Al_{x1}Ga_{1-x1}N$ ($0.5\leqq x1\leqq1$) in which the atomic ratio of Al is 0.5 or more. It is more preferable that the nitride semiconductor layer made of AlN is stacked by the sputtering method. When nitride semiconductor buffer layer 2 is provided by stacking, by the sputtering method, a nitride semiconductor layer formed of a nitride semiconductor represented by an expression $Al_{x1}Ga_{1-x1}N$ ($0.5\leqq x1\leqq1$) in which the atomic ratio of Al is 0.5 or more, particularly when the nitride semiconductor layer made of AlN is stacked by the sputtering method, it becomes possible to stack nitride semiconductor buffer layer 2 formed of an aggregate of columnar crystals each having an array of crystal grains extending in the perpendicular direction (vertical direction) with respect to the surface of substrate 1. When nitride semiconductor underlying layer 3 is stacked on the surface of nitride semiconductor buffer layer 2 formed of an aggregate of the columnar crystals as described above, there is an increasing tendency that nitride semiconductor underlying layer 3 having a low dislocation density can be achieved. It is considered this is because the c-axis orientation of nitride semiconductor buffer layer 2 is excellent when nitride semiconductor buffer layer 2 grows in a columnar shape, which allows reduction in displacement of a Tilt component at the time when crystals are gathered, and particularly allows reduction in screw dislocation.

In this case, it is preferable to use a reactive sputtering method as a sputtering method. The reactive sputtering method is a method for forming nitride semiconductor buffer layer 2 using, as material, metal containing a III group element such as Al, Ga and In, and gas containing nitrogen which is a V group element such as nitrogen gas and ammonia gas. The reactive sputtering method is preferable in that this method tends to allow a decrease in the impurity concentration in nitride semiconductor buffer layer 2.

Furthermore, various types of schemes for achieving plasma discharge can be used in the reactive sputtering method. The reactive sputtering method may include, for example, a DC magnetron sputtering method in the DC-continuous scheme, a DC magnetron sputtering method in the DC-pulse scheme, an RF magnetron sputtering method in the RF scheme, an ECR sputtering method, or the like. In particular, the DC magnetron sputtering method in the DC-continuous scheme carried out by applying a voltage in the DC-continuous scheme is preferable since it causes the least damage to substrate 1, thereby allowing an excellent crystal to be achieved.

Figure 11:
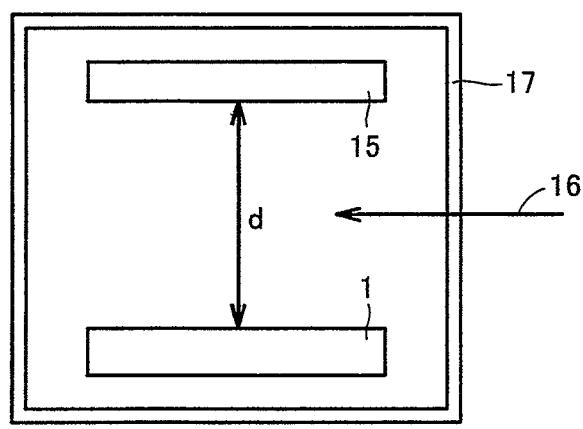
FIG. 11 is a schematic configuration diagram of an example of a sputtering apparatus used for stacking a nitride semiconductor buffer layer on the surface of the substrate by the sputtering method in the second embodiment.

FIG. 11 is a schematic configuration diagram of an example of a sputtering apparatus used for stacking nitride semiconductor buffer layer 2 on the surface of substrate 1 by the sputtering method in the second embodiment.

In this case, the sputtering apparatus includes a reactor 17 in which substrate 1 and a target 15 containing, for example, Al are disposed at a distance d such that the surfaces of substrate 1 and target 15 face each other.

Then, after supplying gas 16 into reactor 17, a voltage is applied between substrate 1 and target 15, to generate plasma of gas 16 for sputtering target 15, and then stacking nitride semiconductor buffer layer 2 on the surface of substrate 1.

In this case, it is preferable that the gas containing nitrogen gas but not containing argon gas is supplied as gas 16. When gas 16 containing nitrogen gas but not containing argon gas is supplied to stack nitride semiconductor buffer layer 2 by the sputtering method, argon is introduced as impurities into nitride semiconductor buffer layer 2. Consequently, deterioration in the crystallinity of nitride semiconductor buffer layer 2 can be prevented.

Furthermore, distance d between the surface of substrate 1 and the surface of target 15 (the shortest distance between the center of the surface of target 15 and the surface of substrate 1) is preferably 100 mm or more and 250 mm or less, and more preferably 150 mm or more and 210 mm or less. When the above-described distance d is 100 mm or more and 250 mm or less, and particularly 150 mm or more and 210 mm or less, the crystallinity in nitride semiconductor buffer layer 2 can be improved since the damage to substrate 1 can be reduced at the time when nitride semiconductor buffer layer 2 is stacked by the sputtering method. In addition, plasma can be efficiently generated to achieve formation at excellent formation speed, which tends to allow nitride semiconductor buffer layer 2 having excellent crystallinity to be provided.

Figure 12:
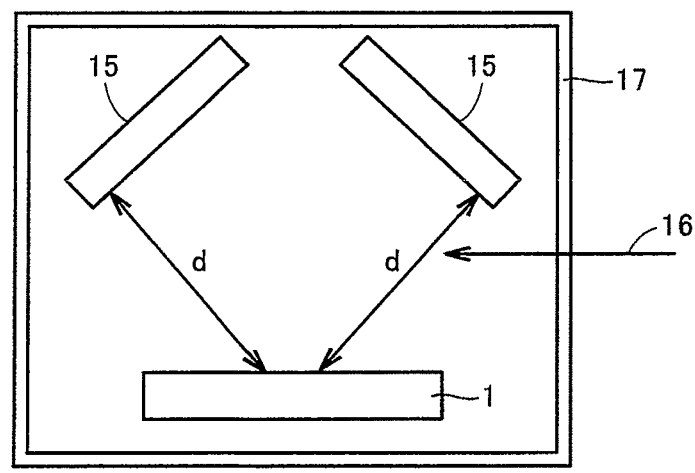
FIG. 12 is a schematic configuration diagram of an example of the sputtering apparatus used for stacking the nitride semiconductor buffer layer on the surface of the substrate by the sputtering method in the second embodiment.

Furthermore, for the purpose of reducing damage to substrate 1, as shown in the schematic configuration diagram in FIG. 12, it is preferable that nitride semiconductor buffer layer 2 is formed on the surface of substrate 1 by the sputtering method in the state where target 15 is inclined with respect to substrate 1. When target 15 is inclined with respect to substrate 1, the entire surface of substrate 1 and the entire surface of target 15 do not face each other as shown in FIG. 11. Accordingly, the damage to the surface of substrate 1 can be reduced to allow formation of nitride semiconductor buffer layer 2 having excellent crystallinity.

Furthermore, with regard to the pressure of the atmosphere within reactor 17 of the sputtering apparatus, it is preferable that the pressure immediately before starting plasma generation is set to 105% or more and 120% or less of the pressure at the time when nitride semiconductor buffer layer 2 is formed by the sputtering method. In this case, plasma can be more efficiently generated, which tends to allow more efficient formation of nitride semiconductor buffer layer 2 by the sputtering method.

As described above, when nitride semiconductor buffer layer 2 is provided by stacking, by the sputtering method, a nitride semiconductor layer formed of a nitride semiconductor represented by an expression $Al_{x1}Ga_{1-x1}N$ ($0.5 \leq x1 \leq 1$) in which the atomic ratio of Al is 0.5 or more, and particularly when the nitride semiconductor layer made of AlN is stacked by the sputtering method, nitride semiconductor buffer layer 2 can be formed from an aggregate of columnar crystals extending in the perpendicular direction with respect to the surface of substrate 1.

Then, by combining nitride semiconductor buffer layer 2 configured as described above and silicon nitride layer 4, nitride semiconductor buffer layer 2 formed of an aggregate of columnar crystals extending in the perpendicular direction with respect to the surface of substrate 1 significantly contributes to reduction in screw dislocation, and silicon nitride layer 4 causes first nitride semiconductor layer 5 to grow in the horizontal direction, and accordingly, significantly contributes to reduction in edge dislocation.

Therefore, in the second embodiment, the propagation of each of screw dislocation and mixed dislocation (dislocation having edge dislocation and screw dislocation mixed) can be efficiently suppressed in one element, which is difficult in the conventional technique. This allows formation of second nitride semiconductor layer 6 that is significantly reduced in dislocation density.

According to the technique of the second embodiment as described above, it is sufficiently possible to suppress the etch pit density reflecting the dislocation density in the surface of second nitride semiconductor layer 6 to approximately $1 \times 10^6 /cm^2$. The nitride semiconductor layer is stacked on the surface of second nitride semiconductor layer 6 having an etch pit density suppressed as described above, which allows fabrication of a nitride semiconductor element having excellent characteristics.

Since the description other than the above in the present embodiment is the same as that in the first embodiment, detailed description thereof will not be repeated.

Third Embodiment

The present embodiment is characterized in that not a nitride semiconductor light-emitting diode element but a nitride semiconductor laser element is fabricated.

Figure 13:
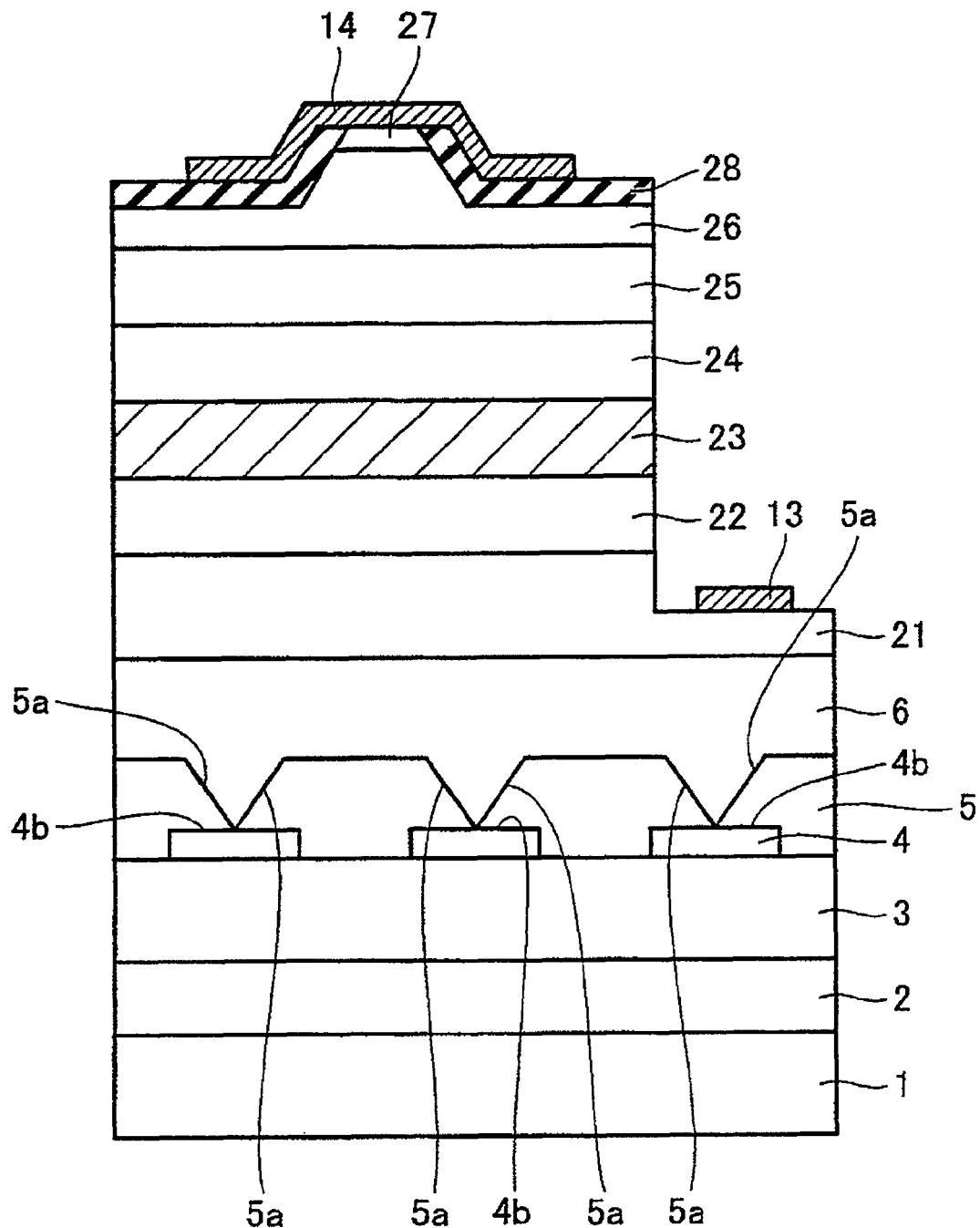
FIG. 13 is a schematic cross sectional view of a nitride semiconductor laser element according to the third embodiment.

FIG. 13 is a schematic cross sectional view of a nitride semiconductor laser element according to the third embodiment which is another example of the nitride semiconductor element of the present invention.

In the nitride semiconductor laser element according to the third embodiment, on the surface of substrate 1, nitride semiconductor buffer layer 2, nitride semiconductor underlying layer 3, silicon nitride layer 4, first nitride semiconductor layer 5, second nitride semiconductor layer 6, an n-type nitride semiconductor clad layer 21, an n-type nitride semiconductor light guide layer 22, a nitride semiconductor active layer 23, a nitride semiconductor protection layer 24, a p-type nitride semiconductor light guide layer 25, a p-type nitride semiconductor clad layer 26, and a p-type nitride semiconductor contact layer 27 are stacked in this order. An insulating film 28 is formed so as to cover the surface of p-type nitride semiconductor clad layer 26 and the side surface of p-type nitride semiconductor contact layer 27. Then, n-side electrode 13 is provided in contact with the exposed surface of n-type nitride semiconductor clad layer 21, and p-side electrode 14 is provided in contact with the exposed surface of p-type nitride semiconductor contact layer 27.

In this case, also in the nitride semiconductor laser element according to the third embodiment, first nitride semiconductor layer 5 has an inclined facet 5a which is a surface inclined with respect to a surface 4b of silicon nitride layer 4.

Described below is an example of the method for manufacturing a nitride semiconductor laser element according to the third embodiment. First, as in the first embodiment, nitride semiconductor buffer layer 2, nitride semiconductor underlying layer 3, silicon nitride layer 4, first nitride semiconductor layer 5 having inclined facet 5a, and second nitride semiconductor layer 6 are stacked in this order on the surface of substrate 1.

Figure 14:
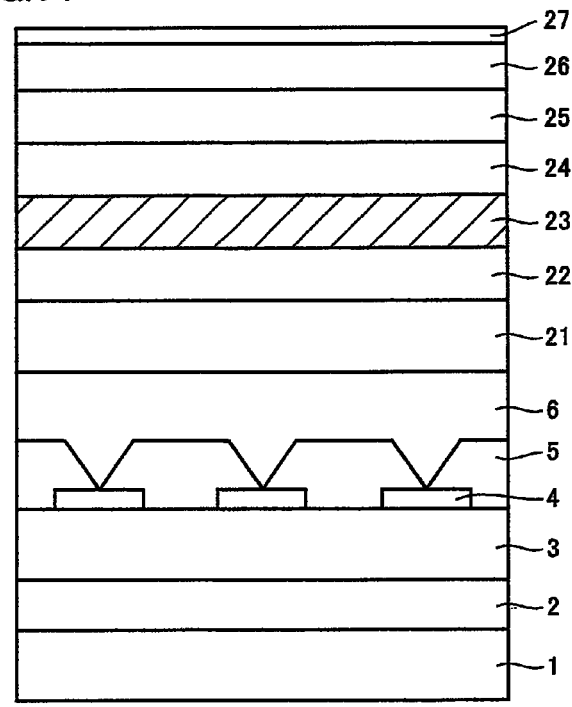
FIG. 14 is a schematic cross sectional view illustrating a part of the manufacturing step in an example of a method for manufacturing the nitride semiconductor laser element according to the third embodiment.

Then, as shown in the schematic cross sectional view in FIG. 14, by using the MOCVD method, n-type nitride semiconductor clad layer 21, n-type nitride semiconductor light guide layer 22, nitride semiconductor active layer 23, nitride semiconductor protection layer 24, p-type nitride semiconductor light guide layer 25, p-type nitride semiconductor clad layer 26, and p-type nitride semiconductor contact layer 27 are stacked in this order on the surface of second nitride semiconductor layer 6, to form a stacked body.

In this case, n-type nitride semiconductor clad layer 21 can be provided, for example, by stacking a layer doped with an n-type dopant, and the like on the nitride semiconductor layer formed of a nitride semiconductor which is represented by an expression $Al_{x12}Ga_{y12}In_{z12}N$ ($0 \leq x12 \leq 1$, $0 \leq y12 \leq 1$, $0 \leq z12 \leq 1$, $x12+y12+z12 \neq 0$).

Furthermore, n-type nitride semiconductor light guide layer 22 can be provided, for example, by stacking a layer doped with an n-type dopant, and the like on the nitride semiconductor layer formed of a nitride semiconductor which is represented by an expression $Al_{x13}Ga_{y13}In_{z13}N$ ($0 \leq x13 \leq 1$, $0 \leq y13 \leq 1$, $0 \leq z13 \leq 1$, $x13+y13+z13 \neq 0$).

Furthermore, nitride semiconductor active layer 23 can be provided, for example, by alternately stacking, one by one, a nitride semiconductor layer formed of a nitride semiconductor which is represented by an expression $Al_{x14}Ga_{y14}In_{z14}N$ ($0 \leq x14 \leq 1$, $0 \leq y14 \leq 1$, $0 \leq z14 \leq 1$, $x14+y14+z14 \neq 0$) and a nitride semiconductor layer formed of a nitride semiconductor which is represented by an expression $Al_{x15}Ga_{y15}In_{z15}N$ ($0 \leq x15 \leq 1$, $0 \leq y15 \leq 1$, $0 \leq z15 \leq 1$, $x15+y15+z15 \neq 0$), which are different in composition from each other.

Furthermore, nitride semiconductor protection layer 24 can be provided, for example, by stacking a nitride semiconductor layer formed of a nitride semiconductor which is represented by an expression $Al_{x16}Ga_{y16}In_{z16}N$ ($0 \leq x16 \leq 1$, $0 \leq y16 \leq 1$, $0 \leq z16 \leq 1$, $x16+y16+z16 \neq 0$).

Furthermore, p-type nitride semiconductor light guide layer 25 can be provided, for example, by stacking a layer doped with a p-type dopant, and the like on the nitride semiconductor layer formed of a nitride semiconductor which is represented by an expression $Al_{x17}Ga_{y17}In_{z17}N$ ($0 \leq x17 \leq 1$, $0 \leq y17 \leq 1$, $0 \leq z17 \leq 1$, $x17+y17+z17 \neq 0$).

Furthermore, p-type nitride semiconductor clad layer 26 can be provided, for example, by stacking a layer doped with a p-type dopant, and the like on the nitride semiconductor layer formed of a nitride semiconductor which is represented by an expression $Al_{x18}Ga_{y18}In_{z18}N$ ($0 \leq x18 \leq 1$, $0 \leq y18 \leq 1$, $0 \leq z18 \leq 1$, $x18+y18+z18 \neq 0$).

Furthermore, p-type nitride semiconductor contact layer 27 can be provided, for example, by stacking a layer doped with a p-type dopant, and the like on the nitride semiconductor layer formed of a nitride semiconductor which is represented by an expression $Al_{x19}Ga_{y19}In_{z19}N$ ($0 \leq x19 \leq 1$, $0 \leq y19 \leq 1$, $0 \leq z19 \leq 1$, $x19+y19+z19 \neq 0$).

Figure 15:
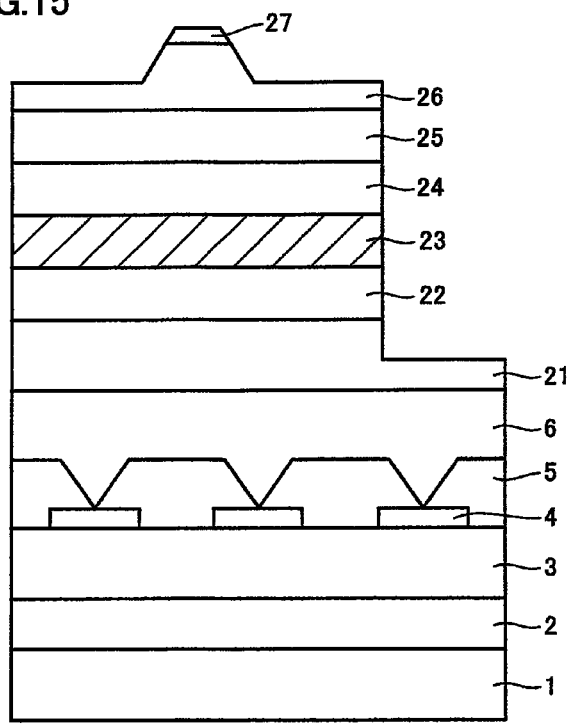
FIG. 15 is a schematic cross sectional view illustrating another part of the manufacturing step in an example of the method for manufacturing the nitride semiconductor laser element according to the third embodiment.

Then, as shown in the schematic cross sectional view in FIG. 15, a part of each of p-type nitride semiconductor clad layer 26 and p-type nitride semiconductor contact layer 27 in the stacked body shown in FIG. 14 is removed by etching and the like to expose a part of the surface of p-type nitride semiconductor clad layer 26. In addition, a part of the stacked body shown in FIG. 14 is removed by etching and the like to expose a part of the surface of n-type nitride semiconductor clad layer 21.

Then, as shown in FIG. 13, while exposing the surface of p-type nitride semiconductor contact layer 27, insulating film 28 made, for example, of silicon oxide and the like is formed so as to cover the exposed surface of p-type nitride semiconductor clad layer 26. Then, n-side electrode 13 is formed on the surface in which n-type nitride semiconductor clad layer 21 is exposed, and p-side electrode 14 is formed on insulating film 28 so as to be in contact with p-type nitride semiconductor contact layer 27, which allows fabrication of the nitride semiconductor laser element according to the third embodiment.

Also in the nitride semiconductor laser element according to the third embodiment, first nitride semiconductor layer 5 has inclined facet 5a which is a surface inclined with respect to surface 4b of silicon nitride layer 4. Accordingly, also in the nitride semiconductor laser element according to the third embodiment, the propagation of dislocation to second nitride semiconductor layer 6 can be suppressed by deflecting the propagation direction of dislocation in first nitride semiconductor layer 5, which allows improved crystallinity and excellent surface flatness in second nitride semiconductor layer 6.

Accordingly, in the nitride semiconductor laser element according to the third embodiment, the dislocation density can be decreased to allow improvement in crystallinity in each of n-type nitride semiconductor clad layer 21, n-type nitride semiconductor light guide layer 22, nitride semiconductor active layer 23, nitride semiconductor protection layer 24, p-type nitride semiconductor light guide layer 25, p-type nitride semiconductor clad layer 26, and p-type nitride semiconductor contact layer 27 stacked on the surface of second nitride semiconductor layer 6. Consequently, characteristics such as oscillation characteristics of laser light can be improved.

Furthermore, as in the second embodiment, the nitride semiconductor layer formed of a nitride semiconductor represented by an expression $Al_{x1}Ga_{1-x1}N$ ($0.5 \leq x1 \leq 1$) and nitride semiconductor buffer layer 2 made of AlN are formed by the sputtering method, which allows formation of second nitride semiconductor layer 6 that is significantly reduced in dislocation density. When second nitride semiconductor layer 6 having an etch pit density of the surface suppressed to approximately $1 \times 10^6/cm^2$ is used, the characteristics of the nitride semiconductor laser element according to the third embodiment can be significantly improved.

Since the description other than the above in the present embodiment is the same as that in each of the first and second embodiments, detailed description thereof will not be repeated.

Fourth Embodiment

The present embodiment is characterized in that a nitride semiconductor transistor element which is an example of an electronic device is fabricated instead of a light-emitting device such as a nitride semiconductor light-emitting diode element and a nitride semiconductor laser element.

Figure 16:
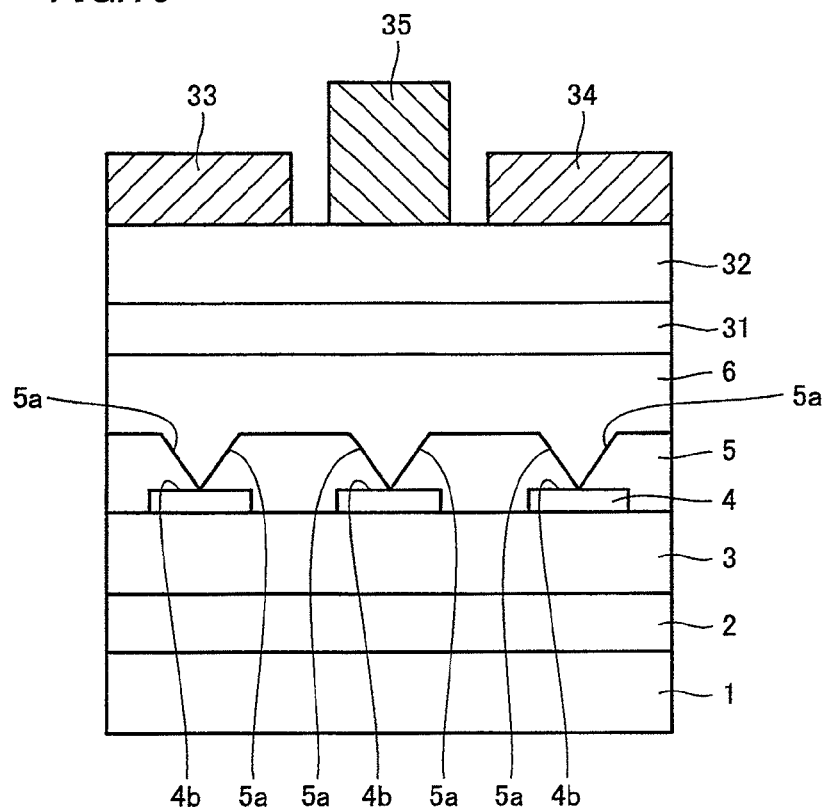
FIG. 16 is a schematic cross sectional view of a nitride semiconductor transistor element according to the fourth embodiment.

FIG. 16 is a schematic cross sectional view of a nitride semiconductor transistor element according to the fourth embodiment which is another example of the nitride semiconductor element of the present invention.

In this case, in the nitride semiconductor transistor element according to the fourth embodiment, nitride semiconductor buffer layer 2, nitride semiconductor underlying layer 3, silicon nitride layer 4, first nitride semiconductor layer 5, and second nitride semiconductor layer 6 are stacked in this order on the surface of substrate 1. A nitride semiconductor electron transit layer 31 made of undoped GaN and the like is stacked on the surface of second nitride semiconductor layer 6. An n-type nitride semiconductor electron supply layer 32 made of n-type AlGaN and the like is stacked on the surface of nitride semiconductor electron transit layer 31. A source electrode 33, a drain electrode 34 and a gate electrode 35 are formed on the surface of n-type nitride semiconductor electron supply layer 32.

Also in the nitride semiconductor transistor element according to the fourth embodiment, first nitride semiconductor layer 5 has inclined facet 5a which is a surface inclined with respect to surface 4b of silicon nitride layer 4.

Described below is an example of the method for manufacturing a nitride semiconductor transistor element according to the fourth embodiment. First, as in the first embodiment, nitride semiconductor buffer layer 2, nitride semiconductor underlying layer 3, silicon nitride layer 4, first nitride semiconductor layer 5 having inclined facet 5a, and second nitride semiconductor layer 6 are stacked in this order on the surface of substrate 1.

Figure 17:
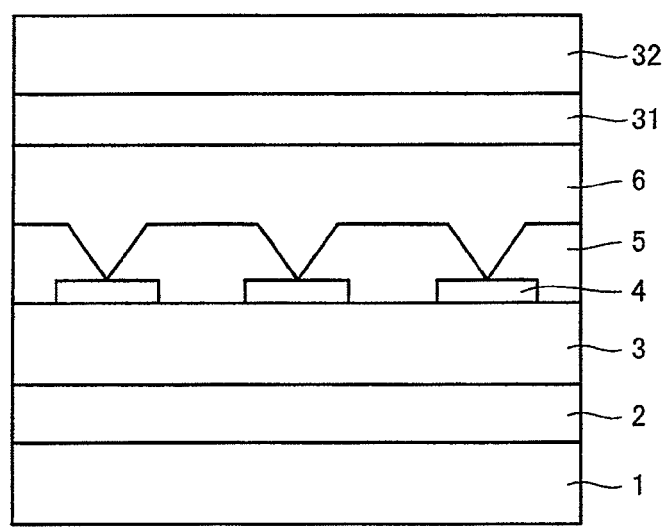
FIG. 17 is a schematic cross sectional view illustrating a part of the manufacturing step in an example of a method for manufacturing the nitride semiconductor transistor element according to the fourth embodiment.

Then, as shown in the schematic cross sectional view in FIG. 17, by using the MOCVD method, nitride semiconductor electron transit layer 31 is stacked on the surface of second nitride semiconductor layer 6, and n-type nitride semiconductor electron supply layer 32 is stacked on the surface of nitride semiconductor electron transit layer 31.

Then, as shown in FIG. 16, source electrode 33, drain electrode 34 and gate electrode 35 are formed on the surface of n-type nitride semiconductor electron supply layer 32, which allows fabrication of the nitride semiconductor transistor element according to the fourth embodiment.

Also in the nitride semiconductor transistor element according to the fourth embodiment, first nitride semiconductor layer 5 has inclined facet 5a which is inclined with respect to surface 4b of silicon nitride layer 4. Accordingly, also in the nitride semiconductor transistor element according to the fourth embodiment, the propagation of dislocation to second nitride semiconductor layer 6 can be suppressed by deflecting the propagation direction of dislocation in first nitride semiconductor layer 5, which allows improved crystallinity and excellent surface flatness in second nitride semiconductor layer 6.

Accordingly, in the nitride semiconductor transistor element according to the fourth embodiment, the crystallinity can be improved by decreasing the dislocation density in each of n-type nitride semiconductor electron supply layer 32 and nitride semiconductor electron transit layer 31 stacked on the surface of second nitride semiconductor layer 6. Consequently, the characteristics such as electron mobility can be improved.

Furthermore, as in the second embodiment, the nitride semiconductor layer represented by an expression $Al_{x1}Ga_{1-x1}N$ ($0.5 \leqq x1 \leqq 1$) and nitride semiconductor buffer layer 2 made of AlN are formed by the sputtering method, which allows formation of second nitride semiconductor layer 6 that is significantly reduced in dislocation density. When second nitride semiconductor layer 6 having an etch pit density of the surface suppressed to approximately $1 \times 10^6/cm^2$ is used, the characteristics of the nitride semiconductor transistor element according to the fourth embodiment can be significantly improved.

Since the description other than the above in the present embodiment is the same as that in each of the first to third embodiments, detailed description thereof will not be repeated.

Fifth Embodiment

The present embodiment is characterized in that a substrate having a surface provided with a concavo-convex structure is used and a nitride semiconductor layer is stacked on the surface for fabricating a nitride semiconductor light-emitting diode element.

Figure 29:
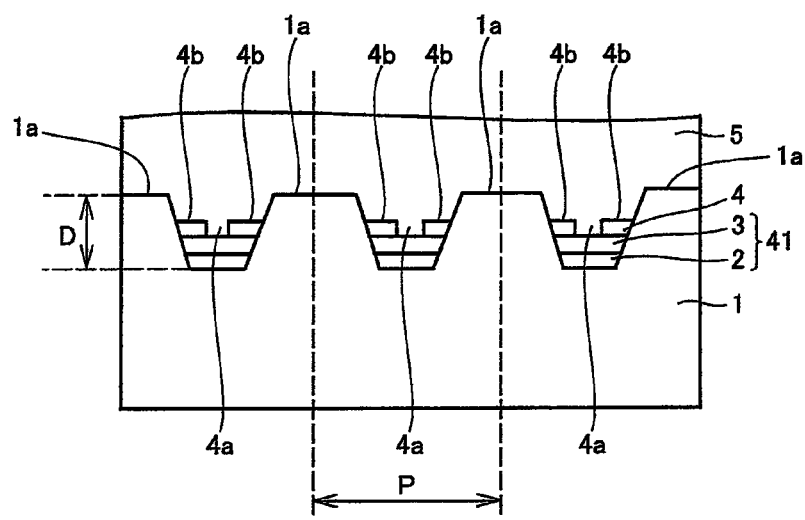
FIG. 29 is a schematic cross sectional view in the vicinity of the substrate of a nitride semiconductor light-emitting diode element according to the fifth embodiment.

FIG. 29 is a schematic cross sectional view in the vicinity of substrate 1 of the nitride semiconductor light-emitting diode element according to the fifth embodiment. In the nitride semiconductor light-emitting diode element according to the fifth embodiment, substrate 1 has a surface provided with a concavo-convex structure, in which a third nitride semiconductor layer 41 (in the present embodiment, corresponding to a stacked body consisting of nitride semiconductor buffer layer 2 and nitride semiconductor underlying layer 3) is stacked in a concave portion of the concavo-convex structure in the surface of substrate 1. Then, silicon nitride layer 4 having an opening 4a is stacked on nitride semiconductor underlying layer 3, and first nitride semiconductor layer 5 is stacked so as to fill opening 4a of silicon nitride layer 4. It is to be noted that the configuration on first nitride semiconductor layer 5 of the nitride semiconductor light-emitting diode element according to the fifth embodiment is the same as that in the first embodiment. Furthermore, a pitch P between convex portions of the concavo-convex structure in the surface of substrate 1 may be set, for example, to approximately 4.5 μm, and a depth D of the concave portion may be set, for example, to approximately 1.2 μm.

In this case, when the surface of substrate 1 has a concavo-convex structure, the light emission efficiency of the nitride semiconductor light-emitting diode element according to the fifth embodiment can be improved due to light scattering by the difference of the refractive index between substrate 1 and third nitride semiconductor layer 41.

Furthermore, when the surface of substrate 1 has a concavo-convex structure, surface 4b of silicon nitride layer 4 is located below an upper surface 1a of the convex portion of the concavo-convex structure in the surface of substrate 1, which allows more effective reduction in the dislocation extending into the nitride semiconductor layer located above first nitride semiconductor layer 5. In other words, in this case, silicon nitride layer 4 is formed such that the surface of substrate 1 may fall within the concave portion of the concavo-convex structure. As described above, it is considered that this is because while the propagation direction of dislocation is deflected in the lateral direction in first nitride semiconductor layer 5 which grows within the concave portion of the concavo-convex structure in the surface of substrate 1, first nitride semiconductor layer 5 can be grown in the lateral direction in the area from the concave portion to the convex portion in the surface of substrate 1, which allows the dislocation in first nitride semiconductor layer 5 to be concentrated in the vicinity of the convex portion in the surface of substrate 1.

In addition, it is considered that when the surface of substrate 1 has a concavo-convex structure and surface 4b of silicon nitride layer 4 is located below upper surface 1a of the convex portion of the concavo-convex structure in the surface of substrate 1, the dislocation extending into the nitride semiconductor layer located above first nitride semiconductor layer 5 can be effectively reduced for the reasons as described above, even if first nitride semiconductor layer 5 does not have inclined facet 5a. However, for the purpose of further effectively reducing the dislocation extending into the nitride semiconductor layer located above first nitride semiconductor layer 5, it is preferable to combine the configuration in which the surface of substrate 1 has a concavo-convex structure, the configuration in which surface 4b of silicon nitride layer 4 is located below upper surface 1a of the convex portion of the concavo-convex structure in the surface of substrate 1, and the configuration in which first nitride semiconductor layer 5 has inclined facet 5a. It is to be noted that third nitride semiconductor layer 41 and silicon nitride layer 4 may be simultaneously formed in the convex portion. Also in this case, since silicon nitride layer 4 can be formed in the concave portion, the same effect as described above can be achieved.

Since the description other than the above in the present embodiment is the same as that in each of the first to fourth embodiments, detailed description thereof will not be repeated.

EXAMPLES

Example 1

Figure 18:
FIG. 18 is a schematic cross sectional view illustrating a part of the manufacturing step of an n-type GaN layer according to Example 1.

First, a sapphire substrate 101 shown in the schematic cross sectional view in FIG. 18 was placed within the reactor of a DC magnetron sputtering apparatus operated to apply a voltage in the DC-continuous scheme, and sapphire substrate 101 was heated to a temperature of 750° C.

Then, after supplying only nitrogen gas into the reactor of the DC magnetron sputtering apparatus at a flow rate of 15 sccm, the pressure within the reactor was kept at 0.08 Pa, and a high frequency bias of 50 W was applied to the sapphire substrate 101 side, to expose the surface of sapphire substrate 101 to nitrogen plasma, thereby nitriding the surface of sapphire substrate 101.

Then, after supplying argon gas and nitrogen gas into the reactor of the DC magnetron sputtering apparatus, the temperature of sapphire substrate 101 was lowered to 500° C.

Figure 19:
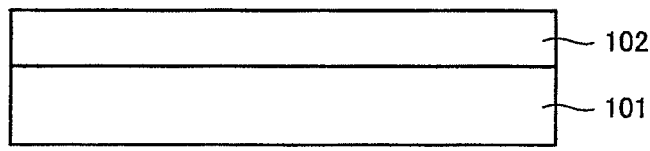
FIG. 19 is a schematic cross sectional view illustrating another part of the manufacturing step of the n-type GaN layer according to Example 1.

Then, nitrogen plasma was generated by applying a high frequency bias of 3000 W to the target side made of metal Al which is disposed inclined with respect to the surface of sapphire substrate 101, keeping the pressure within the reactor at 0.6 Pa, and supplying nitrogen gas (the volume ratio of the nitrogen gas to the entire gas is 100%) into the reactor at a flow rate of 5 sccm. Then, the pressure within the reactor was kept at 0.5 Pa, to stack an MN buffer layer 102 having a thickness of 25 nm on the surface of sapphire substrate 101, as shown in the schematic cross sectional view in FIG. 19, by the reactive sputtering method carried out using the DC magnetron sputtering method in which a voltage is applied in the DC-continuous scheme. In this case, MN buffer layer 102 was formed of an aggregate of columnar crystals made of MN extending in the perpendicular direction with respect to the surface of sapphire substrate 101, and the growth speed of MN buffer layer 102 was 0.04 nm/sec. Furthermore, distance d between the surface of sapphire substrate 101 and the surface of the target (the shortest distance between the center of the surface of the target and the surface of sapphire substrate 101) was set to 250 mm.

In addition, the magnet within the target inside of the reactor was caused to swing both in the case of nitriding of the surface of sapphire substrate 101 and stacking of AlN buffer layer 102 on the surface of sapphire substrate 101.

After stacking AlN buffer layer 102, generation of nitrogen plasma within the reactor was stopped, and the temperature of sapphire substrate 101 was lowered to room temperature.

Then, sapphire substrate 101 having AlN buffer layer 102 stacked thereon was removed from the reactor of the sputtering apparatus, and placed inside of the reactor of the MOCVD apparatus. Then, the temperature of sapphire substrate 101 was raised to 1050° C., and ammonia gas and TMG (trimethyl gallium) gas as material gas along with hydrogen gas as carrier gas were supplied into the reactor, thereby stacking a GaN layer 103 having a thickness of 2 μm on the surface of AlN buffer layer 102 by the MOCVD method, as shown in the schematic cross sectional view in FIG. 20.

Figure 20:
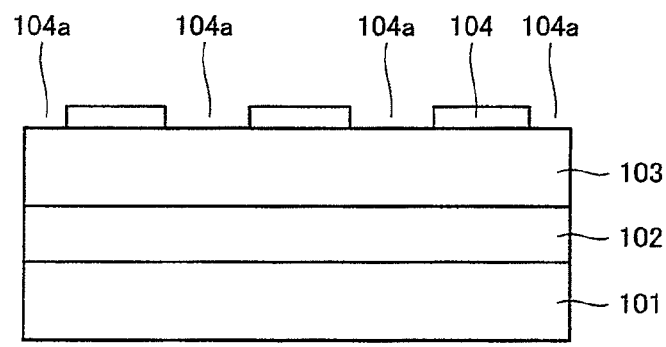
FIG. 20 is a schematic cross sectional view illustrating another part of the manufacturing step of the n-type GaN layer according to Example 1.

Then, in the state where the temperature of sapphire substrate 101 was kept at 1050° C., silane gas and ammonia gas as material gas along with nitrogen gas as carrier gas were supplied into the reactor, thereby stacking an SiN layer 104 having a plurality of openings 104a on the surface of GaN layer 103 by the MOCVD method, as shown in FIG. 20.

Figure 21:
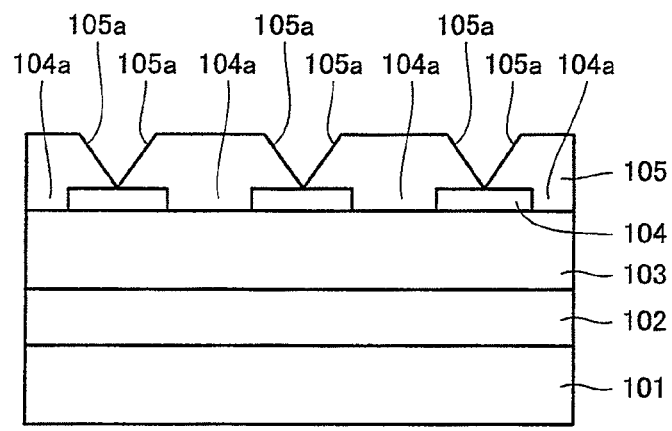
FIG. 21 is a schematic cross sectional view illustrating another part of the manufacturing step of the n-type GaN layer according to Example 1.

Then, in the state where the temperature of sapphire substrate 101 was kept at 1050° C., ammonia gas and TMG gas as material gas along with hydrogen gas as carrier gas were supplied into the reactor so as to achieve a V/III ratio of 483, to cause GaN crystals to selectively grow from the surface of GaN layer 103 exposed from the plurality of openings 104a in SiN layer 104, thereby stacking, on SiN layer 104, a GaN layer 105 as the first nitride semiconductor layer having a thickness of 2 μm and having an inclined facet 105a by the MOCVD method, as shown in the schematic cross sectional view in FIG. 21. It is to be noted that the pressure of the atmosphere during stacking of GaN layer 105 was set at 100 kPa.

Figure 22:
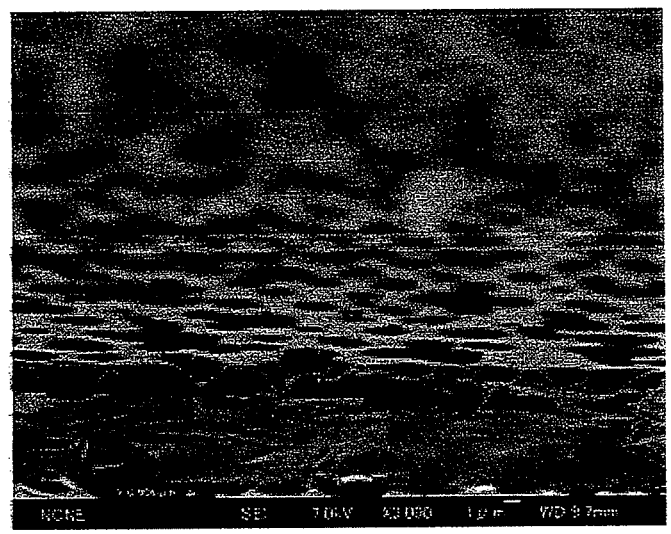
FIG. 22 shows an SEM (Scanning Electron Microscope) image on the surface of a GaN layer as the first nitride semiconductor layer fabricated in the manufacturing step of the n-type GaN layer according to Example 1.

FIG. 22 is an SEM (Scanning Electron Microscope) image on the surface of GaN layer 105 as the first nitride semiconductor layer fabricated as described above. As shown in FIG. 22, it was confirmed that an inclined facet was formed in GaN layer 105 fabricated as described above. Furthermore, it was also confirmed that inclined facet 105a was inclined at an angle of 45° or more and 65° or less with respect to the upper surface of SiN layer 104.

Figure 23:
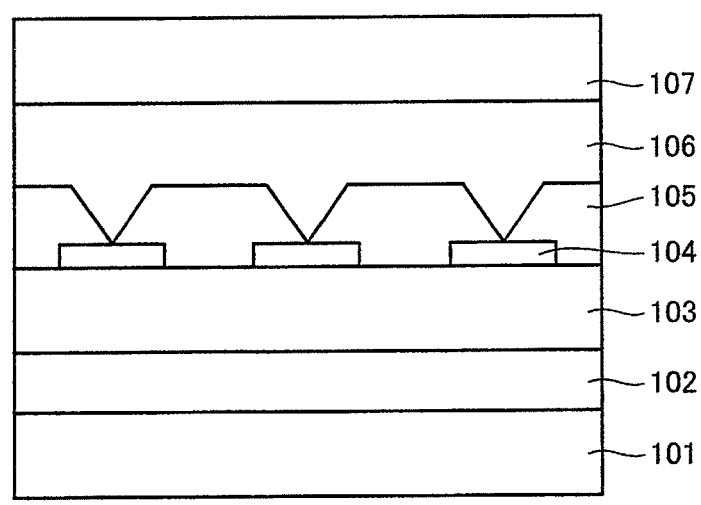
FIG. 23 is a schematic cross sectional view illustrating another part of the manufacturing step of the n-type GaN layer according to Example 1.

Then, in the state where the temperature of sapphire substrate 101 was kept at 1050° C., ammonia gas and TMG gas as material gas along with hydrogen gas as carrier gas were supplied into the reactor so as to achieve a V/III ratio of 1773, thereby stacking a GaN layer 106 as the second nitride semiconductor layer having a thickness of 3 μm on the surface of GaN layer 105 by the MOCVD method, as shown in the schematic cross sectional view in FIG. 23.

Then, in the state where the temperature of sapphire substrate 101 was kept at 1050° C., ammonia gas and TMG gas as material gas along with hydrogen gas as carrier gas were supplied into the reactor so as to achieve a V/III ratio of 1773, and silane gas was supplied into the reactor such that the doping concentration of Si was $5 \times 10^{18}/cm^3$, thereby stacking an n-type GaN layer 107 having a thickness of 3 μm on the surface of GaN layer 106 by the MOCVD method, as shown in FIG. 23.

Then, the temperature of sapphire substrate 101 was lowered to room temperature by lowering the temperature of the atmosphere within the reactor, to remove, from the inside of the reactor, sapphire substrate 101 having n-type GaN layer 107 stacked thereon.

Figure 24:
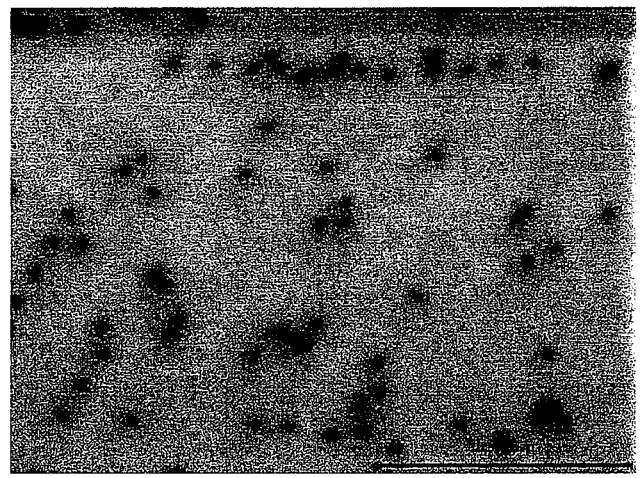
FIG. 24 shows a CL (Cathode Luminescence) image on the surface of the n-type GaN layer according to Example 1.

FIG. 24 is a CL image on the surface of n-type GaN layer 107 according to Example 1 fabricated as described above. When the dislocation density in the surface of n-type GaN layer 107 according to Example 1 was calculated from the density of dark spots shown in FIG. 24, the dislocation density in the surface of n-type GaN layer 107 according to Example 1 was $6 \times 10^7/cm^2$. Furthermore, the half value widths in the (0004) plane and in the (10-12) plane of n-type GaN layer 107 in Example 1 were 59 arcsec and 94 arcsec, respectively.

In addition, in consideration of the fact that the dislocation density in the surface of n-type GaN layer 107 was $2 \times 10^8/cm^2$ which was formed in the same manner as described above except that SiN layer 104 and GaN layer 105 were not formed, the dislocation density in the surface of n-type GaN layer 107 according to Example 1 was not more than one third of the above-mentioned dislocation density. Thus, it was confirmed that high crystallinity can be achieved.

Comparative Example 1

First, as in Example 1, AlN buffer layer 102, GaN layer 103 and SiN layer 104 were stacked in this order on the surface of sapphire substrate 101 by the MOCVD method.

Then, in the state where the temperature of sapphire substrate 101 was kept at 1050° C., ammonia gas and TMG gas as material gas along with hydrogen gas as carrier gas were supplied into the reactor so as to achieve a V/III ratio of 1773, to cause GaN crystals to selectively grow from the surface of GaN layer 103 exposed from the plurality of openings 104a of SiN layer 104, thereby stacking GaN layer 106 as the second nitride semiconductor layer having a thickness of 3 μm on SiN layer 104 by the MOCVD method.

Then, in the state where the temperature of sapphire substrate 101 was kept at 1050° C., ammonia gas and TMG gas as material gas along with hydrogen gas as carrier gas were supplied into the reactor so as to achieve a V/III ratio of 1773, and silane gas was supplied into the reactor such that the doping concentration of Si was $5 \times 10^{18}/cm^3$, thereby stacking n-type GaN layer 107 having a thickness of 3 μm on the surface of GaN layer 106 by the MOCVD method.

Then, the temperature of sapphire substrate 101 was lowered to room temperature by lowering the temperature of the atmosphere within the reactor, to remove, from the inside of the reactor, sapphire substrate 101 having n-type GaN layer 107 stacked thereon.

Then, as in Example 1, when the half value width in each of the (0004) plane and the (10-12) plane of n-type GaN layer 107 in Comparative Example 1 was measured, the half value widths in the (0004) plane and the (10-12) plane of n-type GaN layer 107 in Comparative Example 1 were 96 arcsec and 113 arcsec, respectively.

Comparative Example 2

First, as in Example 1, AlN buffer layer 102, GaN layer 103, SiN layer 104, and GaN layer 105 as the first nitride semiconductor layer were stacked in this order on the surface of sapphire substrate 101 by the MOCVD method.

Then, in the state where the temperature of sapphire substrate 101 was kept at 1050° C., ammonia gas and TMG gas as material gas along with hydrogen gas as carrier gas were supplied into the reactor so as to achieve a V/III ratio of 1773, and silane gas was supplied into the reactor such that the doping concentration of Si was $5 \times 10^{18}/cm^3$, thereby stacking n-type GaN layer 107 having a thickness of 3 μm on the surface of GaN layer 105 by the MOCVD method.

Then, the temperature of sapphire substrate 101 was lowered to room temperature by lowering the temperature of the atmosphere within the reactor, to remove, from the inside of the reactor, sapphire substrate 101 having n-type GaN layer 107 stacked thereon.

Then, as in Example 1, when the half value width in each of the (0004) plane and the (10-12) plane of n-type GaN layer 107 in Comparative Example 2 was measured, the half value widths in the (0004) plane and the (10-12) plane of n-type GaN layer 107 in Comparative Example 2 were 262 arcsec and 275 arcsec, respectively.

Evaluation

When comparing the half value widths in the (0004) plane and the (10-12) plane of n-type GaN layer 107 in each of Example 1, Comparative Example 1 and Comparative Example 2, it is confirmed that the half value width in the above-described crystal plane of n-type GaN layer 107 in Example 1 which is prepared by using the stacked structure of the first nitride semiconductor layer and the second nitride semiconductor layer as an underlying layer is narrower than the half value width in the above-described crystal plane of n-type GaN layer 107 in each of Comparative Example 1 prepared by using only the second nitride semiconductor layer as an underlying layer and Comparative Example 2 prepared by using only the first nitride semiconductor layer as an underlying layer.

Accordingly, it is considered that n-type GaN layer 107 according to Example 1 is excellent in crystallinity than n-type GaN layer 107 in each of Comparative Examples 1 and 2.

Example 2

Sapphire substrate 101 having n-type GaN layer 107 of Example 1 stacked thereon is again placed inside of the reactor of the MOCVD apparatus.

Figure 25:
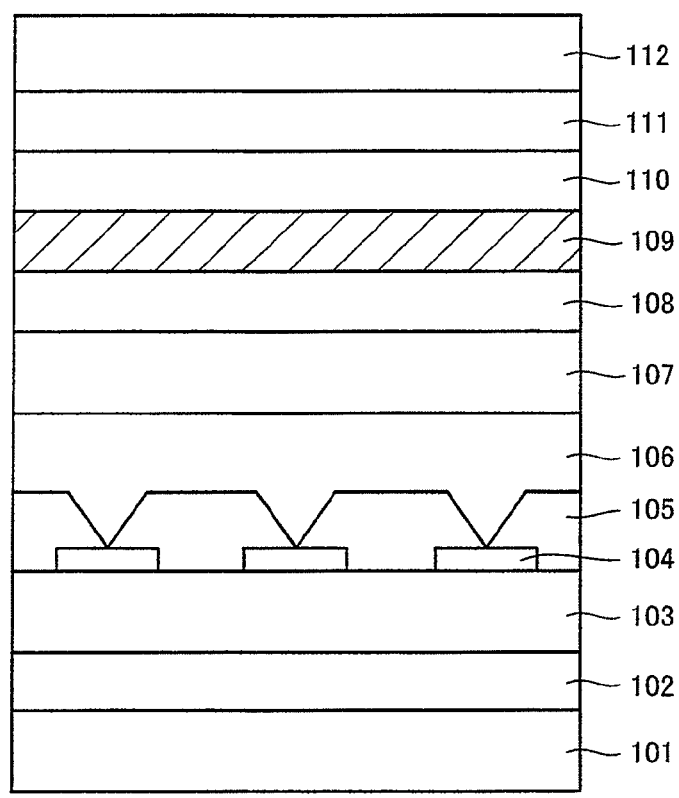
FIG. 25 is a schematic cross sectional view illustrating a part of the manufacturing step of a nitride semiconductor light-emitting diode element according to Example 2.

In the state where the temperature of sapphire substrate 101 is kept at 750° C., TMG gas, TMI gas and ammonia gas as material gas along with nitrogen gas as carrier gas are supplied into the reactor, thereby stacking, by the MOCVD method, a nitride semiconductor superlattice structure layer 108 which has $In_{0.1}Ga_{0.9}N$ layers each having a thickness of 3 nm and GaN layers each having a thickness of 3 nm alternately stacked one by one for ten cycles on the surface of n-type GaN layer 107, as shown in the schematic cross sectional view in FIG. 25. It is to be noted that TMI gas is not supplied into the reactor when the GaN layer is stacked.

Then, the temperature of sapphire substrate 101 is lowered to 700° C., and TMG gas, TMI gas and ammonia gas as material gas along with nitrogen gas as carrier gas are supplied into the reactor, thereby stacking, by the MOCVD method, a nitride semiconductor active layer 109 which has $In_{0.15}Ga_{0.85}N$ layers each having a thickness of 6.5 nm and GaN layers each having a thickness of 3 nm alternately stacked one by one for six cycles on the surface of nitride semiconductor superlattice structure layer 108, as shown in FIG. 25. It is to be noted that the $In_{0.15}Ga_{0.85}N$ layers each serve as a light-emitting layer.

The temperature of sapphire substrate 101 is raised to 1050° C. Then, TMG gas, TMA (trimethyl aluminum) gas and ammonia gas as material gas along with hydrogen gas as carrier gas are supplied into the reactor, and $CP_2Mg$ (cyclopentadienyl magnesium) gas is supplied into the reactor such that the doping concentration of Mg is $5 \times 10^{19}/cm^3$, thereby stacking a p-type AlGaN layer 110 having a thickness of 20 nm on the surface of nitride semiconductor active layer 109 by the MOCVD method, as shown in FIG. 25.

Then, in the state where the temperature of sapphire substrate 101 is kept at 1050° C., TMG gas and ammonia gas as material gas along with hydrogen gas as carrier gas are supplied into the reactor, and $CP_2Mg$ gas is also supplied into the reactor such that the doping concentration of Mg is $5 \times 10^{19}/cm^3$, thereby stacking a p-type GaN layer 111 having a thickness of 80 nm on the surface of p-type AlGaN layer 110 by the MOCVD method, as shown in FIG. 25.

Then, the temperature of sapphire substrate 101 is lowered to 700° C., and nitrogen gas as carrier gas is supplied into the reactor for annealing.

Then, sapphire substrate 101 having subjected to the above-mentioned annealing is removed from inside of the reactor, and an ITO layer 112 having a thickness of 200 nm is stacked on the surface of p-type GaN layer 111 by the EB vapor deposition method.

Figure 26:
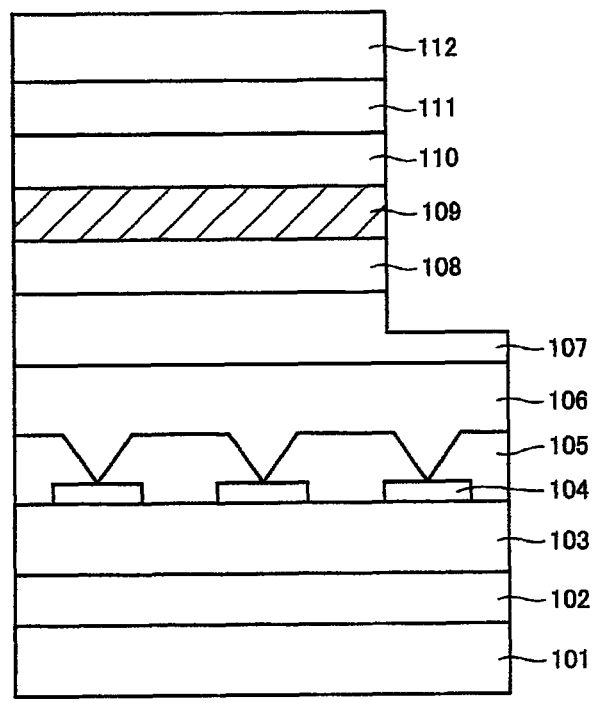
FIG. 26 is a schematic cross sectional view illustrating another part of the manufacturing step of the nitride semiconductor light-emitting diode element according to Example 2.

Then, a mask patterned in a predetermined shape is provided on the surface of ITO layer 112 and subjected to etching from the ITO layer 112 side by the RIE (reactive ion etching) apparatus, thereby exposing a part of the surface of n-type GaN layer 107 as shown in the schematic cross sectional view in FIG. 26.

Figure 27:
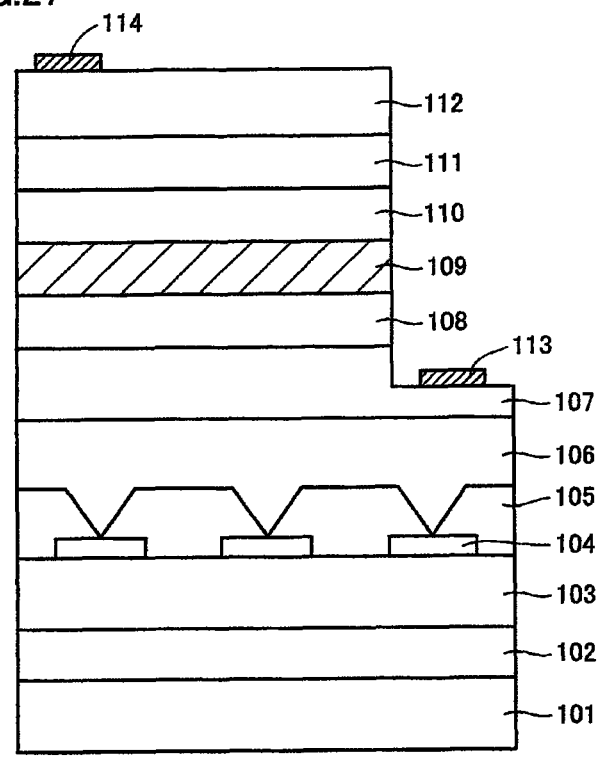
FIG. 27 is a schematic cross sectional view illustrating another part of the manufacturing step of the nitride semiconductor light-emitting diode element according to Example 2.

Then, as shown in the schematic cross sectional view in FIG. 27, a pad electrode 113 containing Ti and Al is formed on the surface of n-type GaN layer 107, and a pad electrode 114 containing Ti and Al is formed on the surface of ITO layer 112, thereby fabricating the nitride semiconductor light-emitting diode element according to Example 2.

The nitride semiconductor light-emitting diode element according to Example 2 is formed by sequentially stacking nitride semiconductor superlattice structure layer 108, nitride semiconductor active layer 109, p-type AlGaN layer 110, p-type GaN layer 111, and ITO layer 112 on the surface of n-type GaN layer 107 with low dislocation density and excellent crystallinity, with the result that high light emission efficiency can be implemented.

Although the present invention has been described and illustrated in detail, it is clearly understood that the same is by way of illustration and example only and is not to be taken by way of limitation, the scope of the present invention being interpreted by the terms of the appended claims.

The present invention can be suitably applied to a nitride semiconductor element such as a light emitting device including a nitride semiconductor light-emitting diode element, a nitride semiconductor laser element and the like, and an electronic device including a nitride semiconductor transistor element and the like; a method for manufacturing the nitride semiconductor element; and a method for manufacturing a nitride semiconductor layer.

What is claimed is:

1. A nitride semiconductor element comprising:
   a substrate;
   a third nitride semiconductor layer having a single-layer structure or a multilayer structure provided on said substrate;
   a silicon nitride layer provided on said third nitride semiconductor layer;
   a first nitride semiconductor layer provided on said silicon nitride layer; and
   a second nitride semiconductor layer provided on said first nitride semiconductor layer,
   at least a part of said first nitride semiconductor layer having a surface inclined with respect to a surface of said silicon nitride layer, and a crystal orientation of a surface of said substrate is inclined in a <11-20> direction or a <1-100> direction with respect to a <0001> direction.

2. The nitride semiconductor element according to claim 1, wherein said surface of said first nitride semiconductor layer is inclined at an angle of 45° or more and 65° or less with respect to said surface of said silicon nitride layer.

3. The nitride semiconductor element according to claim 1, wherein said silicon nitride layer and said first nitride semiconductor layer are in contact with each other.

4. The nitride semiconductor element according to claim 1, wherein said first nitride semiconductor layer and said second nitride semiconductor layer are in contact with each other.

5. The nitride semiconductor element according to claim 1, wherein a nitride semiconductor buffer layer is provided between said substrate and said silicon nitride layer.

6. The nitride semiconductor element according to claim 5, wherein said nitride semiconductor buffer layer is a nitride semiconductor layer formed of a nitride semiconductor represented by an expression $Al_{x1}Ga_{1-x1}N$ ($0<x1\leqq1$).

7. A method for manufacturing a nitride semiconductor element, comprising the steps of:
forming a silicon nitride layer on a substrate;
forming, on said silicon nitride layer, a first nitride semiconductor layer having a surface inclined with respect to a surface of said silicon nitride layer; and
forming, on said first nitride semiconductor layer, a second nitride semiconductor layer to fill a gap defined by the surfaces of the first nitride semiconductor layers each inclined with respect to the surface of said silicon nitride layer, and
wherein a crystal orientation of a surface of said substrate is inclined in a <11-20> direction or a <1-100> direction with respect to a <0001> direction.

8. The method for manufacturing a nitride semiconductor element according to claim 7, wherein a mole ratio of a V group element to a III group element supplied during formation of said second nitride semiconductor layer is greater than the mole ratio of the V group element to the III group element supplied during formation of said first nitride semiconductor layer.

9. The method for manufacturing a nitride semiconductor element according to claim 7, wherein a mole ratio of a V group element to a III group element supplied during formation of said first nitride semiconductor layer is less than 1000.

10. The method for manufacturing a nitride semiconductor element according to claim 7, wherein a mole ratio of a V group element to a III group element supplied during formation of said second nitride semiconductor layer is 1000 or more.

11. The method for manufacturing a nitride semiconductor element according to claim 7, wherein a temperature of said substrate is lower during formation of said first nitride semiconductor layer than during formation of said second nitride semiconductor layer.

12. The method for manufacturing a nitride semiconductor element according to claim 7, wherein said first nitride semiconductor layer is formed by supplying gas containing nitrogen gas.

13. The method for manufacturing a nitride semiconductor element according to claim 7, wherein said first nitride semiconductor layer is formed under a pressure atmosphere of $6.7\times10^4$ Pa or more.

14. The method for manufacturing a nitride semiconductor element according to claim 7, wherein said first nitride semiconductor layer is formed such that the surface of said first nitride semiconductor layer is inclined at an angle of 45° or more and 65° or less with respect to the surface of said silicon nitride layer.

15. The method for manufacturing a nitride semiconductor element according to claim 7, wherein said silicon nitride layer is formed by supplying gas containing nitrogen gas.

16. A method for manufacturing a nitride semiconductor element, comprising the steps of:
forming, on a substrate, a nitride semiconductor buffer layer corresponding to a nitride semiconductor layer formed of a nitride semiconductor represented by an expression $Al_{x1}Ga_{1-x1}N$ ($0<x1\leqq1$);
forming a nitride semiconductor underlying layer on said nitride semiconductor buffer layer;
forming a silicon nitride layer on said nitride semiconductor underlying layer;
forming, on said silicon nitride layer, a first nitride semiconductor layer having a surface inclined with respect to a surface of said silicon nitride layer; and
forming, on said first nitride semiconductor layer, a second nitride semiconductor layer to fill a gap defined by the surfaces of the first nitride semiconductor layers each inclined with respect to the surface of said silicon nitride layer, and
wherein a crystal orientation of a surface of said substrate is inclined in a <11-20> direction or a <1-100> direction with respect to a <0001> direction.

17. A method for manufacturing a nitride semiconductor layer, comprising the steps of:
forming a silicon nitride layer on a substrate;
forming, on said silicon nitride layer, a first nitride semiconductor layer having a surface inclined with respect to a surface of said silicon nitride layer; and
forming, on said first nitride semiconductor layer, a second nitride semiconductor layer to fill a gap defined by the surfaces of the first nitride semiconductor layers each inclined with respect to the surface of said silicon nitride layer, and
wherein a crystal orientation of a surface of said substrate is inclined in a <11-20> direction or a <1-100> direction with respect to a <0001> direction.

18. A method for manufacturing a nitride semiconductor layer, comprising the steps of:
forming, on a substrate, a nitride semiconductor buffer layer corresponding to a nitride semiconductor layer formed of a nitride semiconductor represented by an expression $Al_{x1}Ga_{1-x1}N$ ($0<x1\leqq1$);
forming a nitride semiconductor underlying layer on said nitride semiconductor buffer layer;
forming a silicon nitride layer on said nitride semiconductor underlying layer;
forming, on said silicon nitride layer, a first nitride semiconductor layer having a surface inclined with respect to a surface of said silicon nitride layer; and
forming, on said first nitride semiconductor layer, a second nitride semiconductor layer to fill a gap defined by the surfaces of the first nitride semiconductor layers each inclined with respect to the surface of said silicon nitride layer, and
wherein a crystal orientation of a surface of said substrate is inclined in a <11-20> direction or a <1-100> direction with respect to a <0001> direction.

19. A nitride semiconductor light-emitting element at least comprising:
a substrate;
a third nitride semiconductor layer having a single-layer structure or a multilayer structure provided on said substrate;
a silicon nitride layer provided on said third nitride semiconductor layer;
a first nitride semiconductor layer provided on said silicon nitride layer;
a second nitride semiconductor layer provided on said first nitride semiconductor layer;
a first conductivity type nitride semiconductor layer provided on said second nitride semiconductor layer;
a nitride semiconductor active layer provided on said first conductivity type nitride semiconductor layer; and
a second conductivity type nitride semiconductor layer provided on said nitride semiconductor active layer,
at least a part of said first nitride semiconductor layer having a surface inclined with respect to a surface of said silicon nitride layer, and
a crystal orientation of a surface of said substrate is inclined in a <11-20> direction or a <1-100> direction with respect to a <0001> direction.

20. The nitride semiconductor light-emitting element according to claim 19, wherein said second nitride semiconductor layer contains a surface active element made of at least one of magnesium and zinc.

21. The nitride semiconductor light-emitting element according to claim 20, wherein said surface active element has an atom concentration of $1\times10^{17}/cm^3$ or more and $1\times10^{20}/cm^3$ or less.

22. The nitride semiconductor light-emitting element according to claim 19, wherein said substrate has a concavo-convex structure in a surface thereof on which said third nitride semiconductor layer is provided.

23. The nitride semiconductor light-emitting element according to claim 19, wherein said third nitride semiconductor layer at least includes a nitride semiconductor buffer layer provided on said substrate and a nitride semiconductor underlying layer provided on said nitride semiconductor buffer layer.

24. The nitride semiconductor light-emitting element according to claim 19, wherein an angle of the inclination is 0.05° or more and 2° or less.

25. A nitride semiconductor light-emitting element at least comprising:
a substrate;
a nitride semiconductor lower layer having a single-layer structure or a multilayer structure provided on said substrate;
a silicon nitride layer provided on said nitride semiconductor lower layer;
a nitride semiconductor upper layer provided on said silicon nitride layer;
a first conductivity type nitride semiconductor layer provided on said nitride semiconductor upper layer;
a nitride semiconductor active layer provided on said first conductivity type nitride semiconductor layer; and
a second conductivity type nitride semiconductor layer provided on said nitride semiconductor active layer,
at least a part of said first nitride semiconductor layer having a surface inclined with respect to a surface of said silicon nitride layer, and
a crystal orientation of a surface of said substrate is incline in a <11-20> direction or a <1-100> direction with respect to a <0001> direction.

26. The nitride semiconductor light-emitting element according to claim 25, wherein said substrate has a concavo-convex structure in a surface thereof on which said nitride semiconductor lower layer is provided.

27. The nitride semiconductor light-emitting element according to claim 25, wherein said nitride semiconductor lower layer at least includes a nitride semiconductor buffer layer provided on said substrate and a nitride semiconductor underlying layer provided on said nitride semiconductor buffer layer.

28. The nitride semiconductor light-emitting element according to claim 25, wherein an angle of the inclination is 0.05° or more and 2° or less.

29. A nitride semiconductor light-emitting element at least comprising:
a substrate having a surface provided with a concavo-convex structure;
a third nitride semiconductor layer having a single-layer structure or a multilayer structure provided on said surface of said substrate provided with said concavo-convex structure;
a silicon nitride layer provided on said third nitride semiconductor layer;
a first nitride semiconductor layer provided on said silicon nitride layer;
a second nitride semiconductor layer provided on said first nitride semiconductor layer;
a first conductivity type nitride semiconductor layer provided on said second nitride semiconductor layer;
a nitride semiconductor active layer provided on said first conductivity type nitride semiconductor layer; and
a second conductivity type nitride semiconductor layer provided on said nitride semiconductor active layer,
at least a part of a surface of said silicon nitride layer being located below an upper surface of a convex portion of said concavo-convex structure in said surface of said substrate.

30. The nitride semiconductor light-emitting element according to claim 29, wherein said second nitride semiconductor layer contains a surface active element made of at least one of magnesium and zinc.

31. The nitride semiconductor light-emitting element according to claim 30, wherein said surface active element has an atom concentration of $1\times10^{17}/cm^3$ or more and $1\times10^{20}/cm^3$ or less.

32. The nitride semiconductor light-emitting element according to claim 29, wherein said third nitride semiconductor layer at least includes a nitride semiconductor buffer layer provided on said substrate and a nitride semiconductor underlying layer provided on said nitride semiconductor buffer layer.

33. The nitride semiconductor light-emitting element according to claim 29, wherein a crystal orientation of the surface of said substrate is inclined in a <11-20> direction or a <1-100> direction with respect to a <0001> direction.

34. The nitride semiconductor light-emitting element according to claim 33, wherein an angle of the inclination is 0.05° or more and 2° or less.

35. A nitride semiconductor light-emitting element at least comprising:
a substrate having a surface provided with a concavo-convex structure;
a nitride semiconductor lower layer having a single-layer structure or a multilayer structure provided on said surface of said substrate provided with said concavo-convex structure;

a silicon nitride layer provided on said nitride semiconductor lower layer;

a nitride semiconductor upper layer provided on said silicon nitride layer;

a first conductivity type nitride semiconductor layer provided on said nitride semiconductor upper layer;

a nitride semiconductor active layer provided on said first conductivity type nitride semiconductor layer; and a second conductivity type nitride semiconductor layer provided on said nitride semiconductor active layer, at least a part of a surface of said silicon nitride layer being located below an upper surface of a convex portion of said concavo-convex structure in said surface of said substrate.

36. The nitride semiconductor light-emitting element according to claim 35, wherein said nitride semiconductor lower layer at least includes a nitride semiconductor buffer layer provided on said substrate and a nitride semiconductor underlying layer provided on said nitride semiconductor buffer layer.

37. The nitride semiconductor light-emitting element according to claim 35, wherein a crystal orientation of the surface of said substrate is inclined in a <11-20> direction or a <1-100> direction with respect to a <0001> direction.

38. The nitride semiconductor light-emitting element according to claim 37, wherein an angle of the inclination is 0.05° or more and 2° or less.

* * * * *